United States Patent
Gardner et al.

(10) Patent No.: US 11,498,326 B2
(45) Date of Patent: *Nov. 15, 2022

(54) PRINT COMPONENT WITH MEMORY CIRCUIT

(71) Applicant: HEWLETT-PACKARD DEVELOPMENT COMPANY, L.P., Spring, TX (US)

(72) Inventors: James Michael Gardner, Corvallis, OR (US); Boon Bing Ng, Vancouver, WA (US)

(73) Assignee: Hewlett-Packard Development Company, L.P., Spring, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/768,096

(22) PCT Filed: Jul. 31, 2019

(86) PCT No.: PCT/US2019/044446
§ 371 (c)(1),
(2) Date: May 29, 2020

(87) PCT Pub. No.: WO2020/162969
PCT Pub. Date: Aug. 13, 2020

(65) Prior Publication Data
US 2021/0206164 A1   Jul. 8, 2021

Related U.S. Application Data

(63) Continuation-in-part of application No. PCT/US2019/044446, filed on Jul. 31, 2019, and a
(Continued)

(51) Int. Cl.
*B41J 2/045* (2006.01)
*G06F 3/12* (2006.01)
(Continued)

(52) U.S. Cl.
CPC ......... *B41J 2/04536* (2013.01); *B41J 2/0458* (2013.01); *B41J 2/04541* (2013.01);
(Continued)

(58) Field of Classification Search
CPC ................ B41J 2/04536; B41J 2/04541; B41J 2/04586; G06F 3/1293; G11C 16/10; G11C 16/26
See application file for complete search history.

(56) References Cited

U.S. PATENT DOCUMENTS 5,477,245 A   12/1995   Fuse
5,646,672 A   7/1997   Fukushima
(Continued)

FOREIGN PATENT DOCUMENTS

CN   1292753 A   4/2001
CN   1332412 A   1/2002
(Continued)

*Primary Examiner* — Thinh H Nguyen
(74) *Attorney, Agent, or Firm* — Dicke, Billig & Czaja, PLLC

(57) ABSTRACT

A memory circuit for a print component including a plurality of I/O pads, including an analog pad, to connect to a plurality of signal paths which communicate operating signals to the print component. A memory component stores memory values associated with the print component, and a control circuit, in response to a sequence of operating signals on the I/O pads representing a memory read, provides an analog signal to the analog pad to provide an analog electrical value at the analog pad representing stored memory values selected by the memory read.

24 Claims, 15 Drawing Sheets

Related U.S. Application Data continuation-in-part of application No. PCT/US2019/016725, filed on Feb. 6, 2019.

(51) Int. Cl.

| | | |
|---|---|---|
| *G06F 13/16* | (2006.01) | |
| *G11C 7/10* | (2006.01) | |
| *G11C 16/10* | (2006.01) | |
| *G11C 16/26* | (2006.01) | |

(52) U.S. Cl.
CPC ....... *B41J 2/04555* (2013.01); *B41J 2/04563* (2013.01); *B41J 2/04586* (2013.01); *G06F 3/1293* (2013.01); *G06F 13/1668* (2013.01); *G11C 7/1069* (2013.01); *G11C 16/10* (2013.01); *G11C 16/26* (2013.01); *G11C 2207/105* (2013.01)

(56) References Cited

U.S. PATENT DOCUMENTS

| | | | |
|---|---|---|---|
| 5,801,980 A | 9/1998 | Wong | |
| 5,917,509 A | 6/1999 | Becerra et al. | |
| 5,942,900 A | 8/1999 | DeMeerleer | |
| 6,038,166 A | 3/2000 | Wong | |
| 6,116,714 A | 9/2000 | Imanaka et al. | |
| 6,161,916 A | 12/2000 | Gibson et al. | |
| 6,398,332 B1 | 6/2002 | Silverbrook et al. | |
| 6,616,260 B2 | 9/2003 | Skene et al. | |
| 6,866,359 B2 | 3/2005 | Pan et al. | |
| 7,267,417 B2 | 9/2007 | Silverbrook et al. | |
| 7,506,961 B2 | 3/2009 | Silverbrook | |
| 7,510,255 B2 | 3/2009 | Tamura et al. | |
| 7,613,661 B2 | 11/2009 | Nambudiri | |
| 7,802,858 B2 | 9/2010 | Kasai | |
| 7,874,631 B2 | 1/2011 | Sheahan et al. | |
| 7,954,929 B2 | 6/2011 | Edelen et al. | |
| 8,064,266 B2 * | 11/2011 | Roohparvar | G11C 11/5628 365/185.24 |
| 8,474,943 B2 | 7/2013 | Ness et al. | |
| 8,561,910 B2 | 10/2013 | Depaula et al. | |
| 8,888,226 B1 | 11/2014 | Gardner | |
| 8,960,848 B2 | 2/2015 | Yokouchi | |
| 8,977,782 B2 | 3/2015 | Miyasaka | |
| 9,224,480 B2 | 12/2015 | Grant et al. | |
| 9,472,288 B2 | 10/2016 | Gardner et al. | |
| 9,493,002 B2 | 11/2016 | Edelen et al. | |
| 9,592,664 B2 | 3/2017 | Ge et al. | |
| 2002/0015066 A1 | 2/2002 | Siwinski et al. | |
| 2004/0017437 A1 | 1/2004 | Yamaguchi | |
| 2004/0239712 A1 | 12/2004 | Liao et al. | |
| 2005/0099458 A1 | 5/2005 | Edelen | |
| 2005/0140703 A1 | 6/2005 | Ou | |
| 2007/0194371 A1 | 8/2007 | Benjamin | |
| 2008/0049498 A1 | 2/2008 | Werner | |
| 2009/0040286 A1 | 2/2009 | Tan et al. | |
| 2009/0244132 A1 | 10/2009 | Bruce | |
| 2009/0251969 A1 | 10/2009 | Roohparvar | |
| 2010/0277527 A1 | 11/2010 | Silverbrook et al. | |
| 2010/0302293 A1 | 12/2010 | Torgerson et al. | |
| 2011/0018951 A1 | 1/2011 | Muraki et al. | |
| 2012/0057408 A1 | 3/2012 | Roohparvar et al. | |
| 2013/0106930 A1 | 5/2013 | Lea | |
| 2015/0243362 A1 * | 8/2015 | Nigam | G11C 7/08 365/185.11 |
| 2016/0009079 A1 | 1/2016 | Clark et al. | |
| 2016/0185123 A1 | 6/2016 | Anderson et al. | |
| 2016/0229179 A1 | 8/2016 | Anderson | |
| 2016/0250849 A1 | 9/2016 | Sasaki | |
| 2017/0028724 A1 | 2/2017 | Edelen et al. | |
| 2017/0069639 A1 | 3/2017 | Ge et al. | |
| 2017/0120590 A1 | 5/2017 | Chen | |
| 2017/0355188 A1 | 12/2017 | Anderson et al. | |
| 2018/0001618 A1 | 1/2018 | Anderson et al. | |
| 2018/0086122 A1 | 3/2018 | Anderson | |
| 2018/0154632 A1 | 6/2018 | Chen et al. | |
| 2018/0215147 A1 | 8/2018 | Cumbie et al. | |
| 2018/0345667 A1 | 12/2018 | Edelen et al. | |
| 2019/0016127 A1 | 1/2019 | Linn | |

FOREIGN PATENT DOCUMENTS

| | | |
|---|---|---|
| CN | 1727186 A | 2/2006 |
| CN | 1749980 A | 3/2006 |
| CN | 1960875 A | 5/2007 |
| CN | 101567362 A | 10/2009 |
| CN | 101683788 A | 3/2010 |
| CN | 101868356 A | 10/2010 |
| CN | 101983378 A | 3/2011 |
| CN | 103619601 A | 3/2014 |
| CN | 105280637 A | 1/2016 |
| CN | 105636789 A | 6/2016 |
| CN | 105873765 A | 8/2016 |
| CN | 106685425 A | 5/2017 |
| CN | 107073949 A | 8/2017 |
| CN | 107111537 A | 8/2017 |
| CN | 107206815 A | 9/2017 |
| CN | 107428167 A | 12/2017 |
| CN | 108886366 A | 11/2018 |
| CN | 109922964 A | 6/2019 |
| EP | 1170132 A2 | 1/2002 |
| EP | 1054772 A2 | 7/2003 |
| EP | 1232868 A2 | 8/2006 |
| JP | 61-011845 A | 1/1986 |
| JP | 08-127162 A | 5/1996 |
| JP | 11-207948 A | 8/1999 |
| JP | 2002-014870 A | 1/2002 |
| JP | 2002-519808 A | 7/2002 |
| JP | 2002-232113 A | 8/2002 |
| JP | 2004-050637 A | 2/2004 |
| JP | 2011-517006 A | 5/2011 |
| JP | 2011-230374 A | 11/2011 |
| JP | 2014-017049 A | 1/2014 |
| JP | 2017-533126 A | 11/2017 |
| KR | 20180005525 A | 1/2018 |
| RU | 2579814 C2 | 4/2016 |
| RU | 2635080 C2 | 11/2017 |
| TW | 200631798 A | 9/2006 |
| TW | 201637880 A | 11/2016 |
| TW | 201637881 A | 11/2016 |
| TW | 201813825 A | 4/2018 |
| WO | 97/18953 A1 | 5/1997 |
| WO | WO-2009064271 A1 | 5/2009 |
| WO | 2013/048430 A1 | 4/2013 |
| WO | WO-2014133534 A1 | 9/2014 |
| WO | WO-2016068927 A1 | 5/2016 |
| WO | WO-2017189009 A1 | 11/2017 |
| WO | 2018/017066 A1 | 1/2018 |
| WO | 2018/156617 A2 | 8/2018 |
| WO | WO-2018143942 A1 | 8/2018 |
| WO | WO-2018156171 A1 | 8/2018 |
| WO | 2018/190864 A1 | 10/2018 |
| WO | WO-2019009902 A1 | 1/2019 |
| WO | WO-2019009904 A1 | 1/2019 |

\* cited by examiner

PRINT COMPONENT WITH MEMORY CIRCUIT

CROSS-REFERENCE TO RELATED APPLICATIONS

This application is a U.S. National Stage Application of PCT Application No. PCT/US2019/044446, filed Jul. 31, 2019, entitled "PRINT COMPONENT WITH MEMORY CIRCUIT," which claims priority to PCT Application No. PCT/US2019/016725, filed Feb. 6, 2019, entitled "MULTIPLE CIRCUITS COUPLED TO AN INTERFACE" and PCT Application No. PCT/US2019/016817, filed Feb. 6, 2019, entitled "COMMUNICATING PRINT COMPONENT".

BACKGROUND

Some print components may include an array of nozzles and/or pumps each including a fluid chamber and a fluid actuator, where the fluid actuator may be actuated to cause displacement of fluid within the chamber. Some example fluidic dies may be printheads, where the fluid may correspond to ink or print agents. Print components include printheads for 2D and 3D printing systems and/or other high precision fluid dispense systems.

Figure 1:
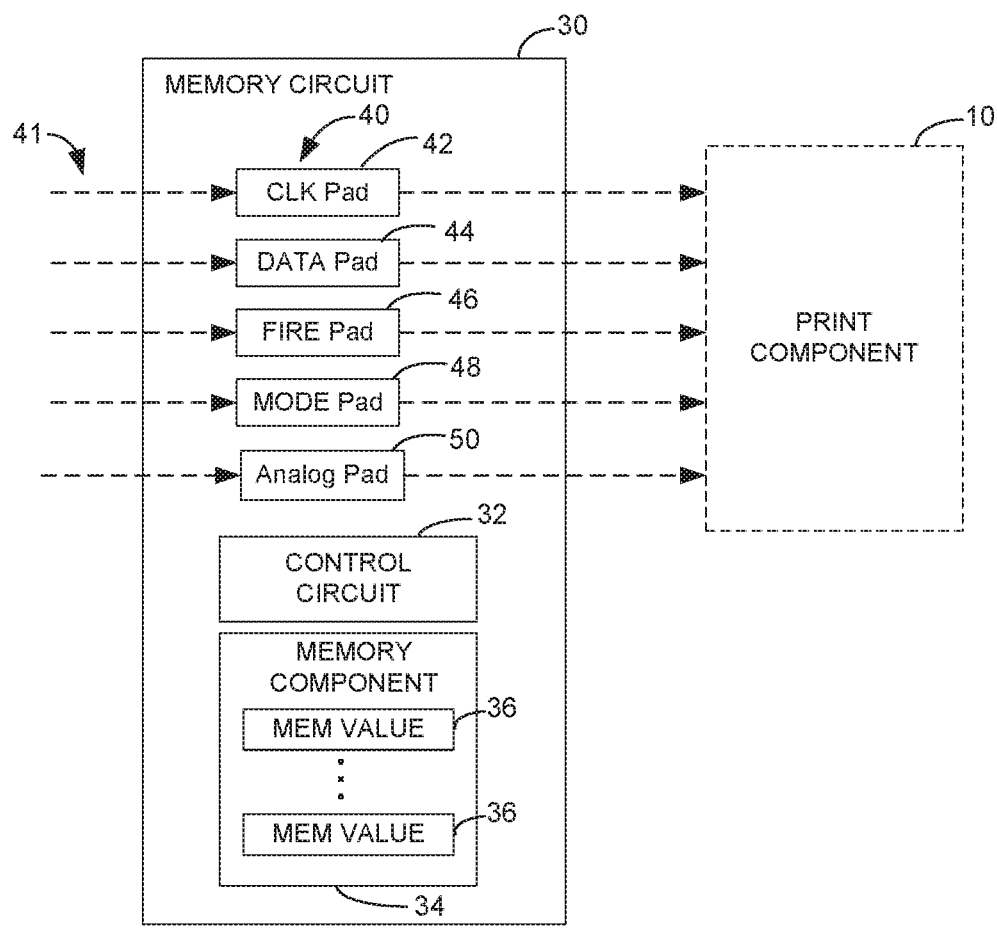
FIG. 1 is a block and schematic diagram illustrating a memory circuit for a print component, according to one example.

Throughout the drawings, identical reference numbers designate similar, but not necessarily identical, elements. The figures are not necessarily to scale, and the size of some parts may be exaggerated to more clearly illustrate the example shown. Moreover the drawings provide examples and/or implementations consistent with the description; however, the description is not limited to the examples and/or implementations provided in the drawings.

DETAILED DESCRIPTION

In the following detailed description, reference is made to the accompanying drawings which form a part hereof, and in which is shown by way of illustration specific examples in which the disclosure may be practiced. It is to be understood that other examples may be utilized and structural or logical changes may be made without departing from the scope of the present disclosure. The following detailed description, therefore, is not to be taken in a limiting sense, and the scope of the present disclosure is defined by the appended claims. It is to be understood that features of the various examples described herein may be combined, in part or whole, with each other, unless specifically noted otherwise.

Example fluidic dies may include fluid actuators (e.g., for ejecting and recirculating fluid), where the fluid actuators may include thermal resistor based actuators, piezoelectric membrane based actuators, electrostatic membrane actuators, mechanical/impact driven membrane actuators, magneto-strictive drive actuators, or other suitable devices that may cause displacement of fluid in response to electrical actuation. Fluidic dies described herein may include a plurality of fluid actuators, which may be referred to as an array of fluid actuators. An actuation event may refer to singular or concurrent actuation of fluid actuators of the fluidic die to cause fluid displacement. An example of an actuation event is a fluid firing event whereby fluid is jetted through a nozzle.

In example fluidic dies, the array of fluid actuators may be arranged in sets of fluid actuators, where each such set of fluid actuators may be referred to as a "primitive" or a "firing primitive." The number of fluid actuators in a primitive may be referred to as a size of the primitive. In some examples, the set of fluid actuators of each primitive are addressable using a same set of actuation addresses, with each fluid actuator of a primitive corresponding to a different actuation address of the set of actuation addresses, with the addresses being communicated via an address bus. In some examples, during an actuation event, in each primitive, the fluid actuator corresponding to the address on the address bus will actuate (e.g., fire) in response to a fire signal (also referred to as a fire pulse) based on a state of the select data (e.g., a select bit state) corresponding to the primitive (sometimes also referred to as nozzle data or primitive data).

In some cases, electrical and fluidic operating constraints of a fluidic die may limit the number of fluid actuators of which can be actuated concurrently during an actuation event. Primitives facilitate selecting subsets of fluid actuators that may be concurrently actuated for a given actuation event to conform to such operating constraints.

By way of example, if a fluidic die includes four primitives, with each primitive having eight fluid actuators (with each fluid actuator corresponding to a different address of a set of addresses 0 to 7, for example), and where electrical and fluidic constraints limit actuation to one fluid actuator per primitive, a total of four fluid actuators (one from each primitive) may be concurrently actuated for a given actuation event. For example, for a first actuation event, the respective fluid actuator of each primitive corresponding to address "0" may be actuated. For a second actuation event, the respective fluid actuator of each primitive corresponding to address "5" may be actuated. As will be appreciated, such example is provided merely for illustration purposes, where fluidic dies contemplated herein may comprise more or fewer fluid actuators per primitive and more or fewer primitives per die.

Example fluidic dies may include fluid chambers, orifices, and/or other features which may be defined by surfaces fabricated in a substrate of the fluidic die by etching, microfabrication (e.g., photolithography), micromachining processes, or other suitable processes or combinations thereof. Some example substrates may include silicon based substrates, glass based substrates, gallium arsenide based substrates, and/or other such suitable types of substrates for microfabricated devices and structures. As used herein, fluid chambers may include ejection chambers in fluidic communication with nozzle orifices from which fluid may be ejected, and fluidic channels through which fluid may be conveyed. In some examples, fluidic channels may be microfluidic channels where, as used herein, a microfluidic channel may correspond to a channel of sufficiently small size (e.g., of nanometer sized scale, micrometer sized scale, millimeter sized scale, etc.) to facilitate conveyance of small volumes of fluid (e.g., picoliter scale, nanoliter scale, microliter scale, milliliter scale, etc.).

In some examples, a fluid actuator may be arranged as part of a nozzle where, in addition to the fluid actuator, the nozzle includes an ejection chamber in fluidic communication with a nozzle orifice. The fluid actuator is positioned relative to the fluid chamber such that actuation of the fluid actuator causes displacement of fluid within the fluid chamber that may cause ejection of a fluid drop from the fluid chamber via the nozzle orifice. Accordingly, a fluid actuator arranged as part of a nozzle may sometimes be referred to as a fluid ejector or an ejecting actuator.

In some examples, a fluid actuator may be arranged as part of a pump where, in addition to the fluidic actuator, the pump includes a fluidic channel. The fluidic actuator is positioned relative to a fluidic channel such that actuation of the fluid actuator generates fluid displacement in the fluid channel (e.g., a microfluidic channel) to convey fluid within the fluidic die, such as between a fluid supply and a nozzle, for instance. An example of fluid displacement/pumping within a die may sometimes be referred to as micro-recirculation. A fluid actuator arranged to convey fluid within a fluidic channel may sometimes be referred to as a non-ejecting or microrecirculation actuator.

In one example nozzle, the fluid actuator may comprise a thermal actuator, where actuation of the fluid actuator (sometimes referred to as "firing") heats the fluid to form a gaseous drive bubble within the fluid chamber that may cause a fluid drop to be ejected from the nozzle orifice. As described above, fluid actuators may be arranged in arrays (such as columns), where the actuators may be implemented as fluid ejectors and/or pumps, with selective operation of fluid ejectors causing fluid drop ejection and selective operation of pumps causing fluid displacement within the fluidic die. In some examples, the array of fluid actuators may be arranged into primitives.

Some fluidic dies receive data in the form of data packets, sometimes referred to as fire pulse groups or as fire pulse group data packets. In some examples, such data packets may include configuration data and select data. In some examples, configuration data includes data for configuring on-die functions, such as address bits representing an address of fluid actuators to be actuated as part of a firing operation, fire pulse data for configuring fire pulse characteristics, and thermal data for configuring thermal operations such as heating and sensing. In some examples, the data packets are configured with head and tail portions including the configuration data, and a body portion including the select (primitive) data. In example fluidic dies, in response to receiving a data packet, on-die control circuitry employs address decoders/drivers to provide the address on an address line, activation logic to activate selected fluid actuators (e.g., based on the address, select data, and a fire pulse), and configuration logic to configure operations of on-die functions, such as fire pulse configuration, crack sensing and thermal operations based on configuration data and a mode signal, for instance.

In addition to fluid actuators, some example fluidic dies include on-die memory (e.g., non-volatile memory (NVM)) to communicate information (e.g., memory bits) with external devices, such as a printer, to assist in controlling operation of the fluidic, including operation of fluid actuators and other devices (e.g., heaters, crack sensors) for regulating fluid ejection. In examples, such information may include thermal behavior, offsets, region information, a color map, fluid levels, and a number of nozzles, for example.

Memories typically include overhead circuitry (e.g., address, decode, read, and write modes, etc.) which are costly to implement and consume relatively large amounts of silicon area on a die. However, since similar circuitry is employed in selecting, actuating, and transferring data to an array of fluid actuators, some example fluidic dies multi-purpose portions of the control circuitry for selecting and transferring data to fluid actuators (including portions of a high speed data path, for example) to also select memory elements of a memory array.

To further save space and reduce complexity associated with multi-bus architectures, some example fluidic dies employ a single lane analog bus which is communicatively connected in parallel with the memory elements to read and write information to/from the memory elements over the shared single lane analog bus (which is also sometimes referred to as a sense bus). In some examples, the single-lane bus is able to read/write to memory elements individually or to different combinations of memory elements in parallel. Additionally, some example fluidic dies include devices such as crack sensors, temperature sensors, and heating elements that may also be connected to the signal-lane analog bus for sensing and control.

In example fluidic dies having on-die memories, in addition to communicating select data to select fluid actuators for actuation as part of a fluid actuation operation, data packets may communicate select data to select memory elements which are to be accessed as part of a memory access operation (e.g., read/write operations). To differentiate between different operating modes, such as between a fluid actuation mode and a memory access mode, example fluidic dies may employ different operating protocols for different modes of operation. For example, a fluid die may employ one protocol sequence of operating signals, such as data (e.g., data packets) received via data pads (DATA), a clock signal received which clock pad (CLK), a mode signal received via a mode pad (MODE), and a fire signal received a fire pad (FIRE), to identify fluid actuator operation, and another sequence of such signals to identify memory access operations (e.g., read and write).

In example fluidic dies, on-die memory elements may be one-time-programmable (OTP) elements. During manufacture, information may be written to the memory elements late in the manufacturing process, including after a fluidic die may have been arranged as a part of a printhead or pen. If the memory is found to be defective (e.g., to have one or more failed bits that will not program properly), the fluidic die may not function properly, such that the fluidic die, printhead, and pen are also defective. Additionally, even though the overhead circuitry of the memory may be shared with fluid actuator selection and activation circuitry, the inclusion of on-die memory elements consumes silicone area and increases dimensions of the fluidic die.

The present disclosure, as will be described in greater detail herein, provides a print component, such as a printhead or a print pen, for example, including a fluidic die having an array of fluid actuators. The fluidic die is coupled to a number of input/output (I/O) terminals communicating operating signals for controlling the operation of the fluidic die, including ejection operations of the fluidic actuators, the I/O terminals including an analog sense terminal. The print component includes a memory die, separate from the fluidic die, coupled to the I/O terminals, the memory die to store memory values associated with the print component, such as manufacturing data, thermal behavior, offsets, region information, a color map, a number of nozzles, and fluid type, for example. According to one example, in response to observing operating signals on I/O terminals representing a memory access sequence of the stored memory values, the memory die provides an analog signal on the sense terminal based on the stored memory values corresponding to the memory access sequence.

As will be described in greater detail herein, in one example, the memory die replaces or substitutes for a defective memory array on the fluidic die, thereby enabling the fluidic die, and a print component employing the fluidic die, such as a print pen, for example, to remain operational. In another example, the memory die can be employed instead of a memory array on the fluidic die, thereby enabling the fluidic die and a printhead employing the fluidic die to be made smaller. In another example, the fluidic die can be employed to supplement a memory array on the fluidic die (e.g., to expand the memory capacity).

FIG. 1 is a block and schematic diagram generally illustrating a memory circuit 30, according to one example of the present disclosure, for a print component, such as a print component 10. Memory circuit 30 includes a control circuit 32, and a memory component 34 storing a number of memory values 36 associated with operation of print component 10. Memory component 34 may comprise any suitable storage element, including any number of non-volatile memories (NVM), such as EPROM, EEPROM, flash, NV RAM, fuse, for example. In one example, memory values 36 may be values stored as a lookup table, where such lookup table may be an array of indexing data, with each memory value having a corresponding address or index. In examples, each memory value 36 represents a data bit having a bit state of "0" or "1", or an analog value (e.g., a voltage or a current) corresponding to a "0" and "1". In examples, memory circuit 30 is a die.

Memory circuit 30 includes a number of input/output (I/O) pads 40 to connect to a plurality of signal paths 41 which communicate operating signals to print component 10. In one example, the plurality of I/O pads 40 includes a CLK Pad 42, a DATA Pad 44, a FIRE Pad 46, a MODE Pad 48, and an Analog Pad 50, which will be described in greater detail below. In examples, control circuit 32 monitors the operating signals conveyed to print component 10 via I/O pads 40. In one example, upon observing a sequence of operating signals representing a memory read (e.g., a "read" protocol), control circuit 32 provides an analog electrical signal to Analog Pad 50 to provide an analog electrical value at Analog Pad 50 representing the stored memory values 36 selected by the memory read. In examples, the analog electrical signal provided to Analog Pad 50 may be one of an analog voltage signal and an analog current signal, and the analog electrical signal may be one of a voltage level and a current level. In examples, Analog Pad 50 may be an analog sense pad connected to an analog sense circuit, and is sometimes referred to herein as SENSE pad 50.

In one example, upon observing a sequence of operating signals representing a memory write (a "write" protocol), control circuit 32 adjusts the values of the stored memory values.

Figure 2:
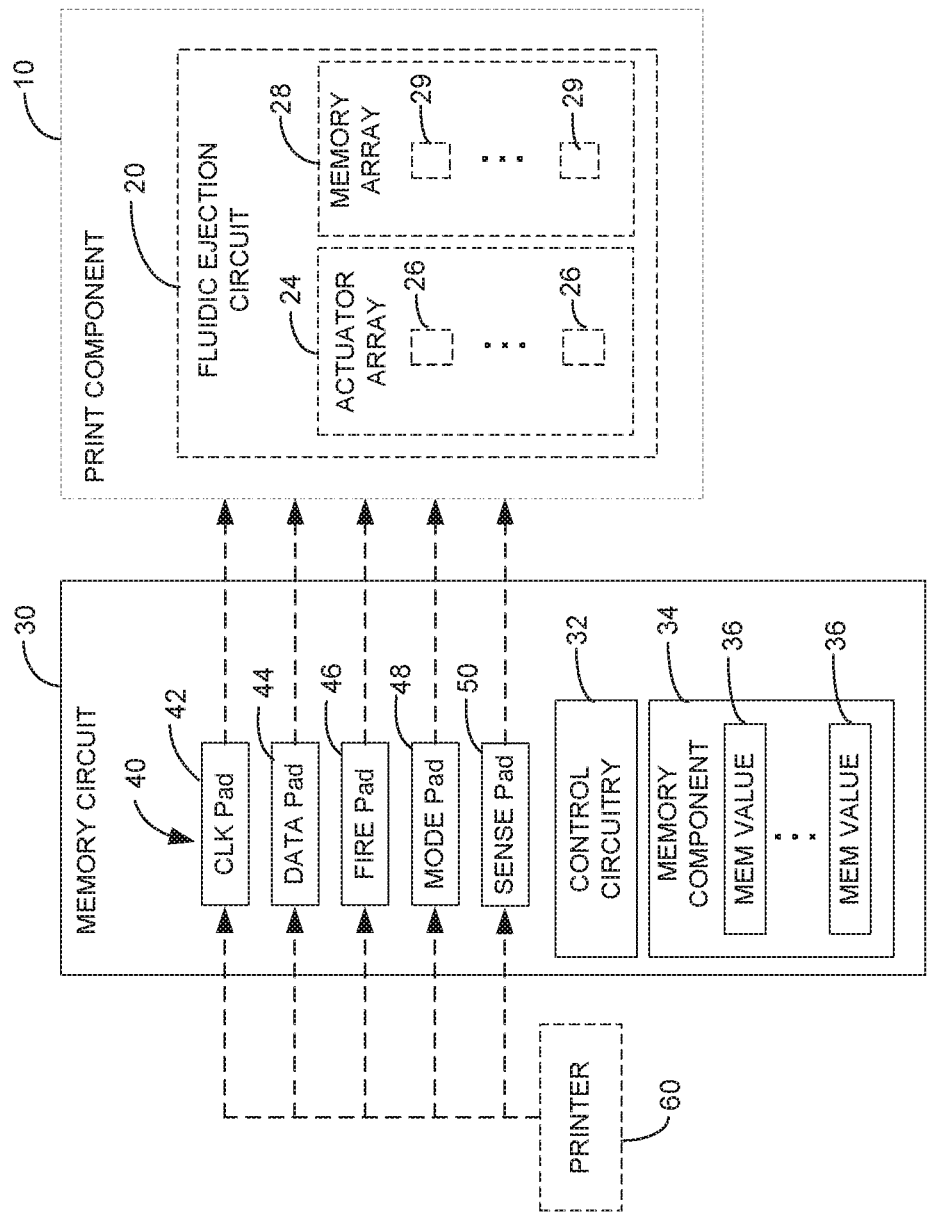
FIG. 2 is a block and schematic diagram illustrating a memory circuit for a print component, according to one example.

FIG. 2 is a block and schematic diagram generally illustrating memory die 30, according to one example, for a print component 10, where print component 10 can be a print pen, a print cartridge, a print head, or may include a number of printheads. In examples, the print component 10 may be removable and replaceable in a printing system. The print component may be a refillable device, and may include a tank, chamber, or container for fluid, such as ink. The print component may include a replaceable container for fluid.

In one example, print component 10 includes a fluid ejection circuit 20, a memory circuit 30, and a number of input/output (I/O) pads 40. Fluid ejection circuit ejection circuit 20 includes an array 24 of fluid actuators 26. In examples, fluid actuators 26 may be arranged to form a number of primitives, with each primitive having a number of fluid actuators 26. A portion of fluid actuators 26 may be arranged as part of a nozzle for fluid ejection, and another portion arranged as part of a pump for fluid circulation. In one example, fluidic ejection circuit 20 comprises a die.

In one example, I/O pads 40 of memory circuit 30 include CLK Pad 42, DATA Pad 44, FIRE Pad 46, MODE Pad 48, and Analog Pad 50 which connect to a plurality of signal paths which convey a number of digital and analog operating signals for operating fluidic ejection circuit 20 between print component 10 and a separate device, such as a printer 60. CLK pad 42 may convey a clock signal, DATA pad 44 may convey data including configuration data and selection data, including in the form of fire pulse group (FPG) data packets, FIRE pad may communicate a fire signal, such as a fire pulse, to initiate an operation of fluidic ejection circuit 20 (such as, for example, operation of selected fluid actuators 24), MODE pad 48 may indicate different modes of operation of fluidic ejection circuit 20, and SENSE pad 50 may convey analog electrical signals for sensing and operation of sensing elements fluidic ejection circuit 20 (such as, for example, crack sensors, thermal sensors, heaters) and memory elements of fluidic ejection circuit 20, such as will be described in greater detail below.

In one example, memory values 36 of memory component 34 of memory circuit 30 are memory values associated with print component 10, including memory values associated with the operation of fluid ejection circuit 20, such as a number of a nozzles, ink levels, operating temperatures, manufacturing information, for example. In examples, similar to that described above, upon observing a sequence of operating signals representing a memory read (e.g., a "read" protocol), control circuit 32 provides an analog electrical signal to Analog Pad 50 to provide an analog electrical value at Analog Pad 50 representing the stored memory values 36 selected by the memory read.

In an example where fluid ejection circuit 20 is implemented as a fluidic die, by disposing memory circuit 30 separately from fluidic ejection circuit 20, such fluidic die can be made with smaller dimensions, such that a printhead including a fluidic die 20 may have smaller dimensions.

In one example, fluidic ejection circuit 20 may include a memory array 28 including a number of memory elements 29 storing memory values associated with the operation of print component 10 and fluidic ejection circuit 20. In one case, where memory array 28 includes defective memory elements 29, memory circuit 30 may serve as a substitute memory (a replacement memory) for memory array 28, with stored memory values 36 replacing values stored by memory elements 29. In another case, memory circuit 30 may supplement memory array 28 (increase the storage capacity associated with fluidic ejection circuitry 20). In one example, as will be described in greater detail below, such as when being employed to replace or substitute for a defective on-die memory array 28, memory circuit 30 may be connected to print component 10 via an overlay wiring substrate (e.g., a flexible overlay) which includes pads that overlay and contact the number of I/O pads 40.

Figure 3:
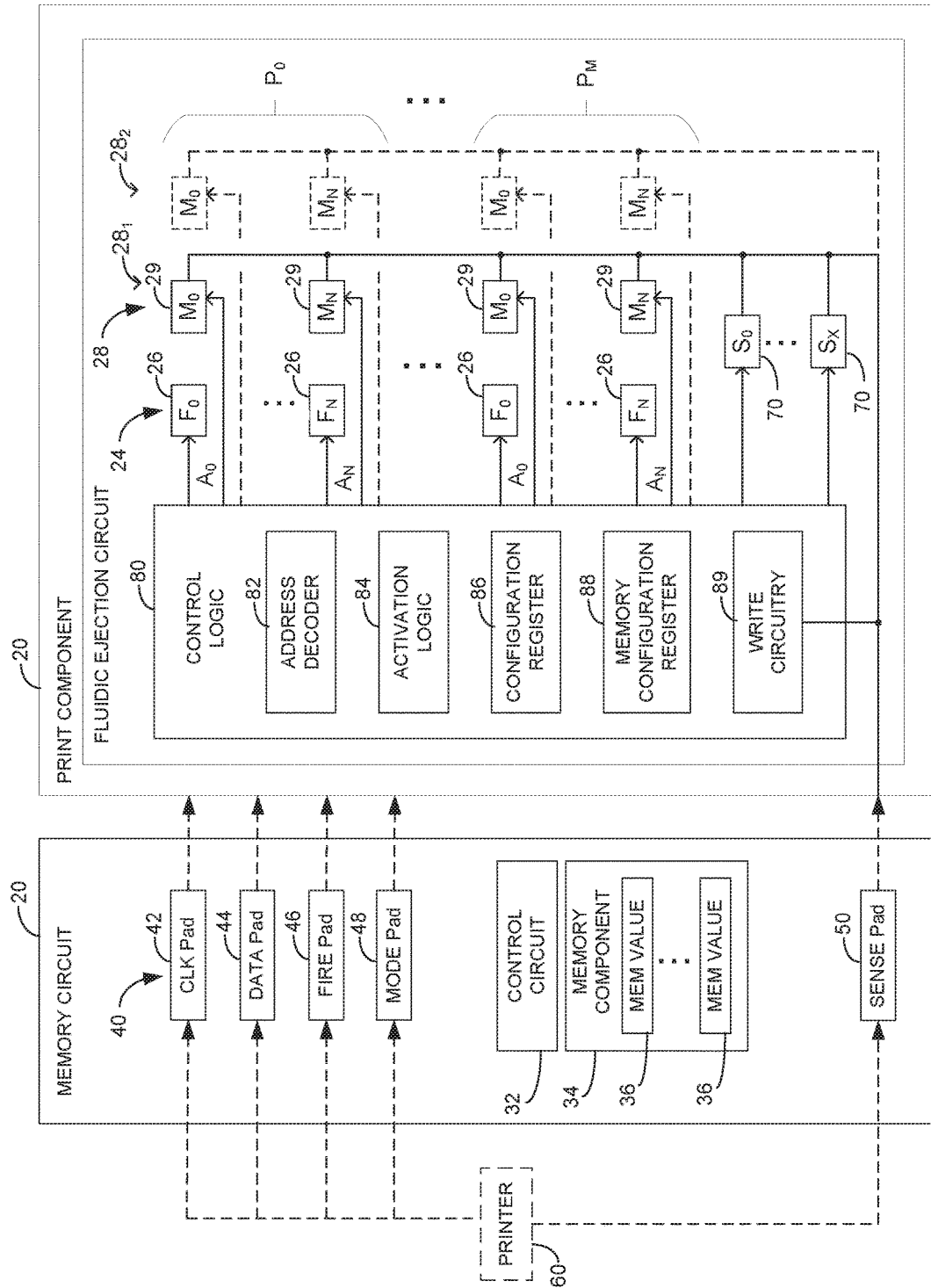
FIG. 3 is a block and schematic diagram illustrating a memory circuit for a print component, according to one example.

FIG. 3 is a block and schematic diagram generally illustrating memory circuit 30 connected to a print component 10 including fluid ejection circuit 20 having a memory array 28, and a memory circuit 30 (e.g., a memory die), according to one example of the present disclosure. In one case, as will be described in greater detail below, memory circuit 30 replaces memory array 28 of fluidic ejection circuit 20, such as when memory array 28 is defective, for example.

Fluidic ejection circuit 20 includes array 24 of fluidic actuators 26, and an array 28 of memory elements 29. In one example, the array 24 of fluid actuators 26 and the array 28 of memory elements 29 are each arrayed to form a column, with each column arranged into groups referred to as primitives, with each primitive $P_0$ to $P_M$ including a number of fluid actuators, indicated as fluid actuators $F_0$ to $F_N$, and a number of memory elements, indicated as memory elements $M_0$ to $M_N$. Each primitive P0 to PM employs a same set of addresses, illustrated as addresses A0 to AN. In one example, each fluid actuator 26 has a corresponding memory element 29 addressable by the same address, such as fluid actuator $F_0$ and memory element $M_0$ of primitive $P_0$ each corresponding to address $A_0$.

In one example, each fluid actuator 26 may have more than one corresponding memory element 29, such as two corresponding memory elements 29, as indicated by the dashed memory elements 29, where the array 28 of memory elements is arranged to form two columns of memory elements 29, such as columns $28_1$ and $28_2$, with each additional memory element sharing the corresponding address. In other examples, each fluid actuator 26 may have more than two corresponding memory elements 29, where each additional memory element 29 is arranged as part of an additional column of memory elements 29 of memory array 28. According to one example, as will be described in greater detail below, where more than one column of memory elements 29 are employed such that more than one memory element 29 shares a same address, each column of memory elements 29 may be separately addressed (or accessed) using column bits in a fire pulse group data packet to identify a column to be accessed.

In one example, fluidic ejection circuit 20 may include a number of sensors 70, illustrated as sensors $S_0$ to $S_X$, to sense a state of fluidic ejection circuit 30, such as temperature sensors and crack sensors, for example. In one example, as will be described in greater detail below, memory elements 29 and sensors 70 may be selectively coupled to sense pad 50, such as via a sense line 52, for access, such as by printer 60. In one example, communication of information to printer 60, such as measurements of cracks and temperatures in regions of fluidic ejection circuit 20, and information stored by memory elements 29 (e.g., thermal behavior, offsets, color mapping, number of nozzles, etc.), enables computation and adjustment of instructions for operation of fluidic ejection circuit 20 (including fluid ejection) according to detected conditions.

In one example, fluidic ejection circuit 20 includes control circuit 80 to control the operation of the array 24 of fluid actuators 26, the array 28 of memory elements 29, and sensors 70. In one example, control circuit 80 includes an address decoder/driver 82, activation/selection logic 84, a configuration register 86, a memory configuration register 88, and write circuitry 89, with address decoder/driver 82 and activation/selection logic 84 being shared to control access to the array 24 of fluid actuators 26 and the array 28 of memory elements 29.

In one example, during a fluid actuation event, control logic 80 receives a fire pulse group (FPG) data packet via data pad 44, such as from printer 60. In one case, the FPG data packet has a head portion including configuration data, such as address data, and a body portion including actuator select data, each select data bit having a select state (e.g., a "1" or a "0") and each select data bit corresponding to a different one of the primitives $P_0$ to $P_M$. Address decoder/driver 82 decodes and provides the address corresponding data packet address data, such as on an address bus, for example. In one example, in response to receiving a fire pulse via fire pad 46 (such as from printer 60), in each primitive P0 to PM, activation logic 84 fires (actuates) the fluid actuator corresponding to the address provided by address decoder/driver 82 when the corresponding select bit is set (e.g., has state of "1").

Similarly, according to examples, during a memory access operation, control logic 80 receives a fire pulse group (FPG) data packet via data pad 44, such as from printer 60. However, rather than including actuator select data, during a memory access operation, the body portion of the FPG data packet includes memory select data, with each select data bit having a select state (e.g., "0" or "1") and corresponding and corresponding to a different one of the primitives P0 to PM. In one example, in response to receiving a fire pulse via fire pad 46, in each primitive P0 to PM, activation logic 84 fires connects the memory element 29 corresponding to the address provided by address decoder/driver 82 to sense line 52 when the corresponding select bit is set (e.g., has state of "1").

In a case where the memory access operation is a "read" operation, an analog response of the memory element 29 (or elements 29) connected to sense line 52 to an analog sense signal (e.g., a sense current signal or a sense voltage signal) provided on sense line 52, such as by printer 60 via sense pad 50, is indicative of a state of the memory element 29 (or elements). In a case where the memory access operation is a "write" operation, memory elements 29 connected to sense line 52 may be programmed to a set state (e.g., to a "1" from a "0") by an analog program signal provided on sense line 52, such as by printer 60 via sense pad 50, or by a write circuit 89 integral with fluidic ejection circuit 20.

During a read operation, a single memory element 29 may be connected to sense line 52 and be read, or a combination (or subset) of memory elements 29 may be connected in parallel to sense line 52 and be read simultaneously based on an expected analog response to an analog sense signal. In examples, each memory element 29 may have known electrical characteristics when in a programmed state (e.g., set to a value of "1") and an unprogrammed state (e.g., having a value of "0"). For example, in one case, memory elements 29 may be floating gate metal-oxide semiconductor field-effect transistors (MOSTFETs) having a relatively high resistance when unprogrammed, and a relatively lower resistance when programmed. Such electrical properties enable known responses to known sense signals to be indicative of a memory state of the memory element 29 (or elements), during a read operation.

For example, if a fixed sense current is applied to sense line 52, a voltage response may be measured that is indicative of a memory state of a selected memory element 29, or memory elements 29. When more than one memory element 29 is connected in parallel to sense line 52, each additional memory element reduces the resistance, which reduces a sense voltage response at sense pad 50 by a predictable amount. As such, information (e.g., program state) may be determined about the combination of selected memory elements 29 based on the measured sense voltage. In examples, a current source internal to fluidic ejection circuit 20 may be used to apply the sense current. In other examples, a current source external to fluidic ejection circuit 20 (e.g., printer 60 via sense pad 50) may be used.

In a corresponding way, if a fixed sense voltage is applied a current response may be measured that is indicative of a memory state of a selected memory element 29 (or memory elements 29). When more than one memory element 29 is connected in parallel to sense line 52, each additional memory element 29 reduces the resistance, which increases a sense current at sense pad 50 by a predictable amount. As such, information (e.g., program state) may be determined about the combination of selected memory elements 29 based on the measured sense current. In examples, a voltage source internal to fluidic ejection circuit 20 may be used to apply the sense voltage. In other examples, a voltage source external to fluidic ejection circuit 20 (e.g., printer 60 via sense pad 50) may be used.

In one case, to enable fluidic ejection circuit 20 to identify a memory access operation so that information is not inadvertently written to memory array 29 during other operations, such as a fluid actuation operation, a unique memory access protocol is used which includes a specific sequence of operating signals received via I/O pads 40. In one example, the memory access protocol begins with DATA pad 44 being raised (e.g., raised to a relatively higher voltage). With DATA pad 44 still being raised, MODE pad 48 is raised (e.g., a mode signal on MODE pad 48 is raised). With the DATA pad 44 and Mode pad 48 raised, control logic 80 recognizes that an access of configuration register 86 is to occur. A number of data bits are then shifted into configuration register 86 from DATA pad 44 with a clock signal on CLK pad 42. In one example, configuration register 86 holds a number of bits, such as 11 bits, for example. In other examples, configuration register 86 may include more than or few than 11 bits. In one example, one of the bits in control register 86 is a memory access bit.

A FPG data packet is then received via DATA pad 44, with the select bits in the body portion of the data packs representing memory element 29 select bits. In one example, the FPG data packet further includes a configuration bit (e.g., in a head or tail portion of the data packet) that, when set, indicates that the FPG is a memory access FPG. When control logic 80 recognizes that both the memory enable bit in configuration register 86 and the memory access configuration data bit in the received FPG packet are "set", control logic 80 enables memory configuration registration (MCR) 88 to receive data via Data pad 44 in a fashion similar to which configuration register 86 received data bits (as described above). According to one example, upon recognizing that both the memory enable bit in configuration register 86 and the memory access configuration data bit in the received FPG packet are "set", a number of data bits are shifted into memory configuration register 88 from DATA pad 44, including a column enable bit to enable a column 28 of memory bits to be accessed, and a read/write enable bit indicating whether the memory access is a read or a write access (e.g., a "0" indicating a memory read and a "1" indicating a memory write). In one example, where fluidic ejection circuit 20 has a memory array 28 having more than one column of memory elements 29, such as columns $28_1$ and $28_2$, configuration data of the FPG data packet communicating the memory select data includes column selection bits to identify which column 28 of data elements is being accessed. The column enable bit of memory configuration register 88 and the column selection bit of the FPG data packet together enable the selected column 28 to be accessed for a memory operation.

After loading data into memory configuration register 88, the fire pulse on FIRE pad 44 is raised, and each memory element 29 corresponding to the address represented in the header of the FPG and having a corresponding memory select bit in the body portion of the FPG which is set (e.g., having a value of "1") is connected to sense bus 52 for a read or a write access, as indicated by the state of the read/write bit of the memory configuration register.

In one example, a read operation of a crack sensor 70 of fluid ejection circuit 30 has a protocol similar to that of a read operation of memory elements 29. Data pad 44 is raised, followed by the mode signal on MODE pad 48 being raised. A number of data bits are then shifted into configuration registration 86. However, in lieu of a configuration data bit corresponding to a read operation of a memory element 29 being set in configuration register 86, a configuration data bit corresponding to a read operation of a crack sensor 70 is set. After data has been shifted into configuration register 86, a FPG is received by control logic 80, where all data bits of the body portion of the FPG have a non-select value (e.g. a value of "0"). The fire pulse signal on FIRE pad 46 is then raised, and the crack sensor 70 is connected to sense line 52. An analog response of crack sensor 70 to an analog sense signal on sense line 52 is indicative of whether crack sensor 70 is detecting a crack (e.g., an analog voltage sense signal produces an analog response current signal, and an analog current sense signal produces an analog response voltage signal).

In one example, a read operation of a thermal sensor 70 is carried out during a fluid ejection operation. In one case, a configuration data bit corresponding to a particular thermal sensor is set in a head or tail portion of the FPG data packet, while the body portion of the FPG includes actuator select data bits, one for each primitive $P_0$ to $P_M$, and having a state indicative of which fluid actuators 26 are to be actuated. When the fire pulse signal on FIRE pad 46 is raised, the selected fluid actuators 26 are fired, and the selected thermal sensor (e.g., a thermal diode) is connected to sense line 52. An analog sense signal applied to the selected thermal sensor via sense line 52 results in an analog response signal on sense line 52 indicative of the temperature of the thermal sensor.

In one example, where memory array 28 of fluidic ejection circuit 20 may include defective memory elements 29 storing incorrect memory values, memory circuit 30 may be connected in parallel with fluidic ejection circuitry 20 to I/O terminals 40 with the memory values 36 of memory component 34 to serve as a replacement memory for memory array 28 and to store correct memory values. In one example, control circuit 32 monitors the operating signals received via I/O pads 42. In one case, upon recognizing a memory access sequence, such as described above, control circuit 32 checks the status of the read/write bit provided to memory configuration register 88 via DATA pad 44.

In one example, where the memory access is a "write" operation, control circuit 32 checks the state of the memory select bits in the body portion of the FPG received via DATA pad 44 to determine which memory elements 29 are indicated as being programmed (e.g., have corresponding select bit which is set (e.g., has a value of "1"). Control circuit 32 then updates the corresponding memory values 36 of memory component 34 to reflect any changes in memory values 36 due to the write operation.

In one example, where the memory access is a "read" operation, control circuit 32 checks the state of the memory select bits in the body portion of the FPG received via DATA pad 44 to determine which memory elements 29 are indicated as being programmed. Control circuit 32 then checks the corresponding memory values 36 in memory component 34 and determines the type of analog sense signal present SENSE pad 50. In one example, in response to the detected analog sense signal, and based on the memory values to be read, control circuit 32 drives an analog response signal on sense line 52 and SENSE pad 50 indicative of the values of memory values 36.

For example, in a case where an analog sense current is provided on sense line 52 via SENSE pad 50, such as by printer 60, and a single memory value is being read, control circuit provides an analog voltage response on sense line 52 which is indicative of the value of the signal memory value being read. For example, if a single memory value is being read, the analog voltage response provided on sense line 52 by control circuit 32 may be a relatively high voltage for an unprogrammed memory value, and may be a relatively lower voltage for a programed memory value. In one example, control circuit 32 provides the analog voltage response on sense line 52 having a value equal to an expected response in view of the known characteristics of memory elements 29, the number of memory elements 29 being read in parallel, and the analog sense signal.

By monitoring operating signals on I/O pads 40 to identify memory access operation (e.g., read/write operations) in order to maintain and update memory values 36, and to provide expected analog response signals on sense line 52 in response to memory read operations, memory circuit 30 is indistinguishable from memory array 28 of fluidic ejection circuit 20 to a device accessing print component 10, such as printer 60.

Figure 4:
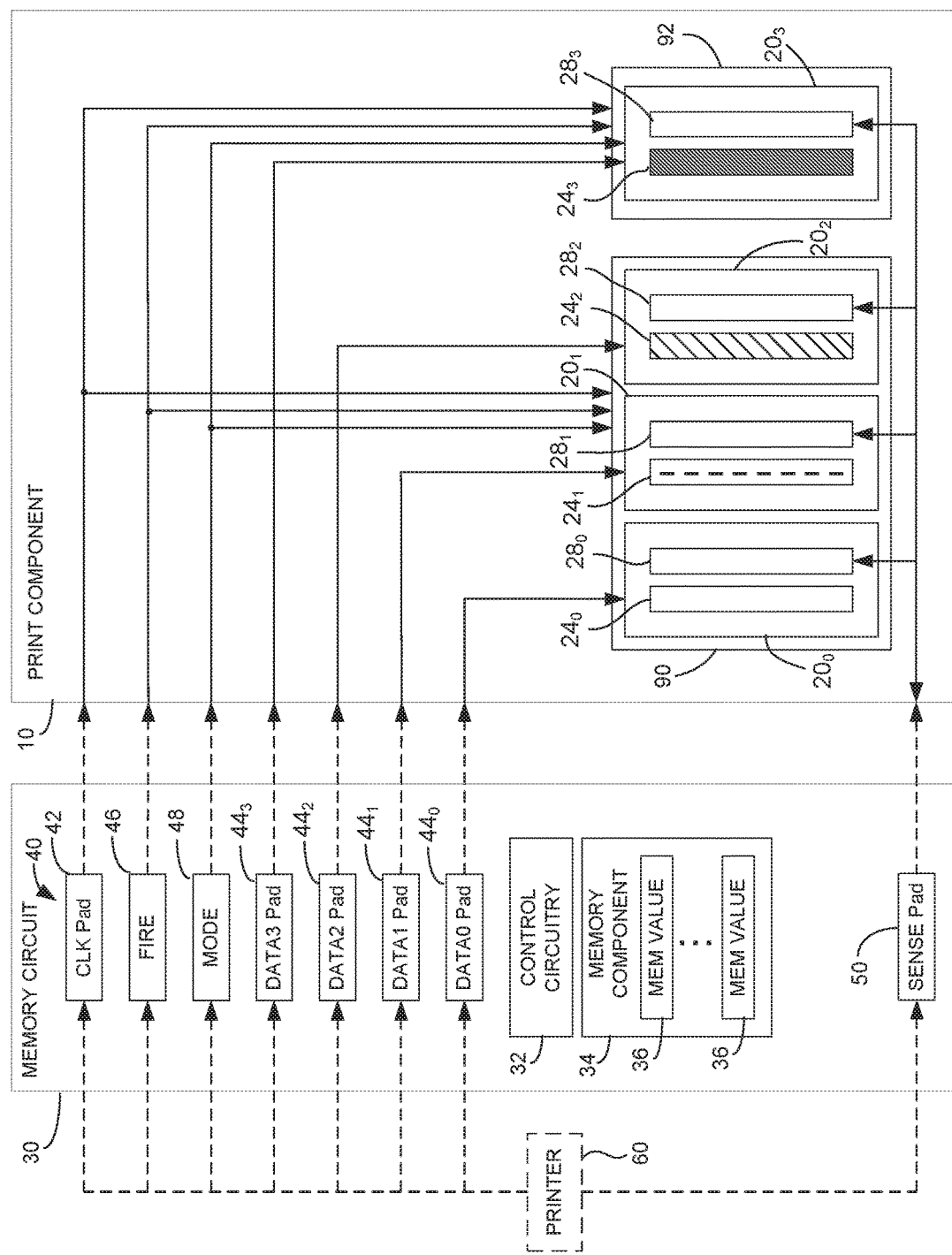
FIG. 4 is a block and schematic diagram illustrating a memory circuit for a print component, according to one example.

FIG. 4 is a block and schematic diagram illustrating memory circuit 30 connected to print component 10, according to one example. In the example of FIG. 4, print component 10 includes a number of fluid ejection circuits 20, illustrated as fluidic ejection circuits $20_0$, $20_1$, $20_2$ and $20_3$, each including an array of fluid actuators 24, illustrated as actuator arrays $24_0$, $24_1$, $24_2$, and $24_3$, and each including a memory array 28, illustrated as memory arrays $28_0$, $28_1$, $28_2$ and $28_3$. In one example, each fluidic ejection circuit 20 comprises a separate fluidic ejection die, with each die providing a different color ink. For example, fluidic ejection die $20_0$ may be a cyan die, fluidic ejection die $20_1$ may be a magenta die, fluidic ejection die $20_2$ may be a yellow die, and fluidic ejection die $20_3$ may be a black die. In example, fluidic ejection dies $20_0$, $20_1$ and $20_2$ are arranged as part of a color print pen 90, and fluid ejection die $20_3$ is arranged as a part of a monochromatic print pen 92.

In one example, each fluidic ejection die $20_0$ to $20_3$ receives data from a corresponding one of data pads $44_0$ to $44_3$, and each share CLK Pad 42, FIRE pad 46, MODE pad 48, and SENSE pad 50. In examples, each of the memory arrays $28_0$, $28_1$, $28_2$ and $28_3$ may be separately accessed during a memory access operation. In other examples, any combination of memory arrays $28_0$, $28_1$, $28_2$ and $28_3$ may be simultaneously accessed during a memory access operation. For example, memory elements from each of the memory arrays $28_0$, $28_1$, $28_2$ and $28_3$ may be simultaneously accessed (e.g., a read operation) via sense line 52, such as by printer 60.

Memory circuit 30 is connected to CLK pad 42, FIRE pad 46, MODE pad 48, and SENSE pad 50, and is connected to each of data pads $44_0$ to $44_3$ so as to be connected in parallel with each of the fluidic ejection dies $20_0$, $20_1$, $20_2$ and $20_3$. In examples, memory circuit 30 may serve as a replacement memory for any combination of memory arrays $28_0$, $28_1$, $28_2$ and $28_3$. For example, in one case, memory circuit 30 may serve as a replacement memory for memory array $24_1$, whereas in another example, memory circuit 30 may serve as a replacement for each of the memory arrays $28_0$, $28_1$, $28_2$ and $28_3$.

In one example, memory circuit 30 may serve as supplemental memory for a fluidic ejection circuit 20. In such case, for memory access operations, memory elements 29 of the fluidic ejection circuit 20 and memory values 36 of memory circuit 30 may be separately identified using column selection bits in the configuration data of FPG data packets communicating memory select data. For example, fluidic ejection circuit $20_3$ of monochromatic print pen 92 may include a memory array $28_3$ having a number of columns of memory elements 29, such as three columns, for instance. In such case, the columns of memory elements of fluidic ejection circuit $20_3$ may be identified by column selection bits of configuration data of the FPG data packet as columns 1-3, and additional columns of memory values 36 of memory component 34 acting as supplemental memory may be identified as additional columns beginning with column 4.

In one example, similar to that described above with respect to FIG. 3, memory circuit 30 monitors operating signals on the number I/O pads 40 to detect a memory access sequence for any of the memory arrays $28_0$, $28_1$, $28_2$ and $28_3$ for which memory circuit 30 serves as a replacement memory.

In one example, when memory circuit 30 serves as a replacement memory for less than all of the fluidic ejection dies $20_0$, $20_1$, $20_2$ and $20_3$ of print component 10, memory elements 29 of fluidic ejection dies 20 for which memory circuit 30 does not serve as a replacement memory are unable to read in parallel with memory elements of fluidic ejection dies 20 for which memory circuit serves as a replacement memory.

Figure 5:
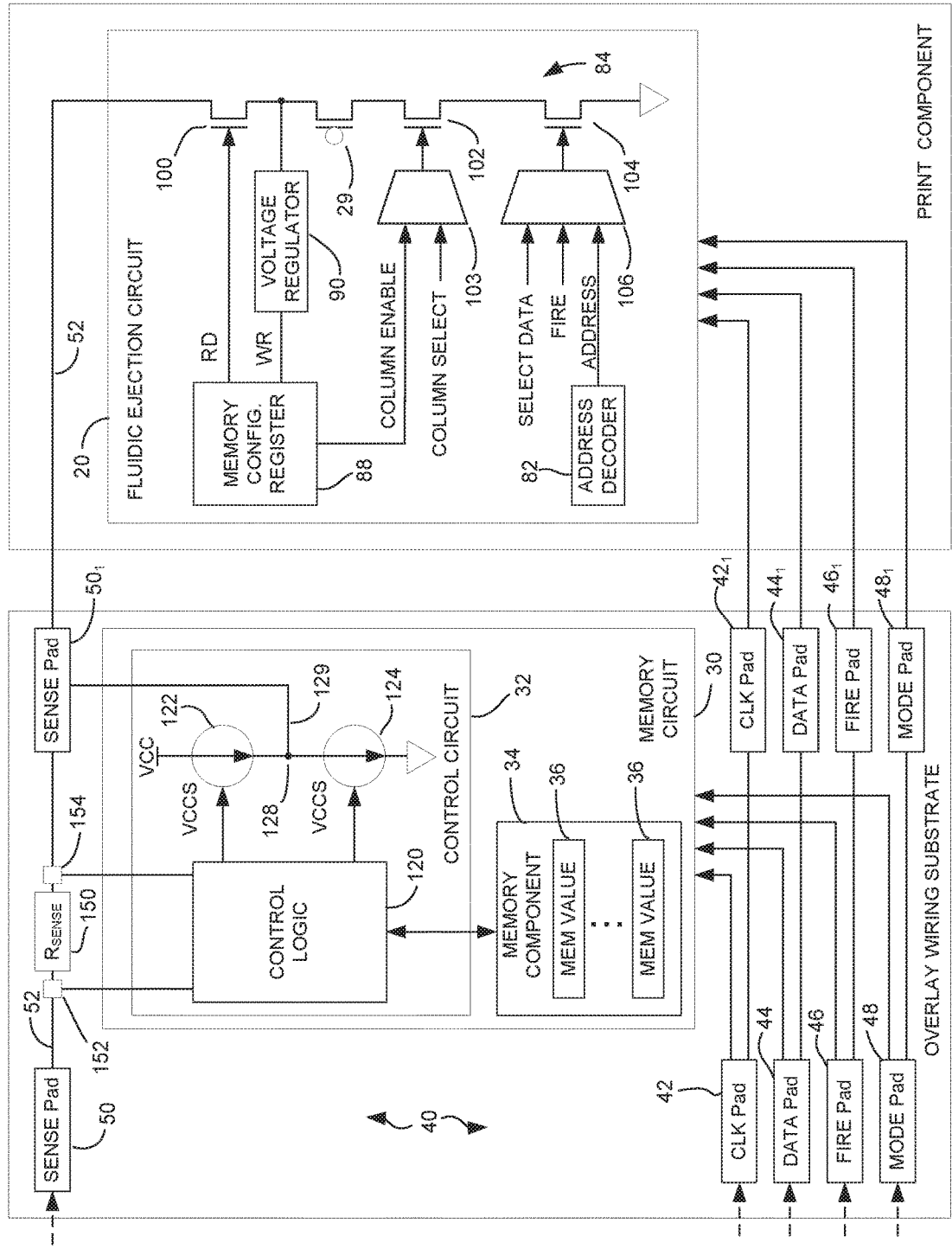
FIG. 5 is a block and schematic diagram illustrating a memory circuit for a print component, according to one example.

FIG. 5 is a block and schematic diagram generally illustrating memory circuit 30 connected to print component 10, according to one example, where portions of print component 10 are also shown. As will be described in greater detail below, according to the example of FIG. 5, memory circuit 30 is connected in parallel with fluidic ejection device 20 to SENSE pad 50 during memory access operations. In example, according to the illustration of FIG. 5, memory circuit 30 may serve as a replacement memory for the array 28 of memory elements 29 of fluidic ejection circuit 20 (where one or more memory elements 29 may be defective).

In one example, activation logic 84 of fluid ejection circuit 20 includes a read enable switch 100, a column activation switch 102 controlled via an AND-gate 103, and a memory element select switch 104 controlled via an AND-gate 106. According to one example, as described above, during a read operation, fluidic ejection circuit 20 receives a fire pulse group including configuration data (e.g., in a head and/or tail portion), and memory select data (e.g., in a body portion). In one example, the configuration data includes a column select bit and address data. The column select bit indicates a particular column of memory elements 29 being accessed when memory array 28 includes more than one column of memory elements, such as columns $28_1$ and $28_2$ in FIG. 3. The address data is decoded by address decoder 82 and provided to activation circuit 84. In one example, the select data includes a number of memory select bits, where each select data bit corresponds to a different primitive ($P_0$ to $P_M$) of the column of memory elements 29, where a select bit which is set (e.g., has a value of "1") enables memory elements 29 of the column 28 to be accessed for reading (or writing).

Additionally, as part of the read operation protocol, memory configuration register 88 is loaded with a column enable bit and a read enable bit. The read enable bit of memory configuration register 88 turns on read enable switch 100. When FIRE is raised, the column enable bit of configuration register 88 together with the column select bit of the configuration data of the fire pulse group cause AND-gate 103 to turn on column activation switch 102 for the selected column, and the select data and address (via address decoder 86) of the fire pulse group, and FIRE signal together cause AND-gate 106 to turn on memory element select switch 104, thereby connecting memory element 29 to sense line 52. It is noted that, in some examples, a column select bit may not be included as part of the fire pulse group configuration data when fluidic ejection circuit 20 includes a single column of memory elements.

Once connected to sense line 52, memory element 29 provides an analog output signal in response to an analog sense signal on sense line 52, where a value of the analog output signal depends on a program state of memory element (where such program state may be defective). In one example, as described above, memory element 29 may have a relatively higher electrical resistance when having a non-programmed state (e.g., a value of "0") than when having a programmed state (e.g., a value of "1"). Accordingly, when the analog sense signal is a fixed analog current (a so-called "forced current mode"), an analog output voltage provided by memory element 29 will have a relatively higher voltage level when memory element 29 has a non-programmed state, and a relatively lower voltage level when memory element 29 has a programmed state. Likewise, when the analog sense signal is a fixed voltage (a so-called "forced voltage mode"), an analog output current provided by memory element 29 will have a relatively lower current level when memory element 29 has a non-programmed state, and a relatively higher current level when memory element 29 has a programmed state.

It is noted that during a write operation, read enable switch 100 is maintained in an open position to disconnect memory element 29 from sense line 52, while column enable switch 102 and memory element select switch 104 are closed. The write enable bit of memory configuration register connects voltage regulator 90 to memory element 29 to apply a program voltage thereto.

Control circuit 32 of memory circuit 30, according to one example, includes control logic 120, a first voltage-controlled current source 122 operating as a current supply to a node 128, and a second voltage controlled current source operating as a current sink from node 128, with node 128 being connected to sense line 52 at second SENSE pad $50_1$ via a control line 129. In the example of FIG. 4, during a memory access operation, memory circuit 20 is connected to sense line 152 in parallel with fluidic ejection circuit 20 at second SENSE pad $50_1$.

In one example, memory circuit 30 is connected in parallel with fluid ejection circuit 20 to I/O pads 40 via an overlay wiring substrate 160, which is described in greater detail below (e.g., see FIG. 6A). In one example, wiring substrate 160 includes a pair of I/O pads for each signal path, with the signal path routed through overlay wiring substrate 160 to print component 10 from the first I/O pad of the pair to the second I/O pad of the pair. For example, wiring substrate 160 includes a pair of CLK pads 42 and $42_1$, a pair of DATA Pads 44 and $44_1$, a pair of FIRE Pads 46 and $46_1$, a pair of MODE Pads 48 and $48_1$, and a pair of SENSE Pads 50 and $50_1$. In one example, in each case, the first pad of the pair of pads connects to the incoming signal line, and the second pad of the pair of pads connects the outgoing signal line to print component 10.

In one example, overlay wiring substrate 160 further includes a sense resistor 150 connected in series with sense line 52, where control logic 120 monitors a voltage on high and low side terminals 152 and 154 of sense resistor 150. In other examples, sense resistor 150 may be arranged as part of control circuit 32 (e.g., see FIG. 10).

Although illustrated as being connected to the signal paths and print component 10 via wiring substrate 160, any number of other implementations may be employed to provide such connection. For instance, in one example, the functionality of wiring substrate 160 may integrated within memory circuit 30.

Memory component 34 includes a number of memory values 36. In one example, each memory value 36 corresponds to a different one of the memory elements 29 of fluidic ejection circuit 20. However, whereas one or more memory elements 29 of fluidic ejection circuit 20 may be defective and store incorrect values, each of the memory values 36 of memory component 34 represents a correct memory value. It is noted that in examples, memory component 34 may include memory values 36 in addition to memory values 36 corresponding to memory elements 29.

In one example, control circuit 32 monitors the operating signals being communicated to fluidic ejection circuit 20 on I/O pads 40, such as from printer 60. In one example, upon detecting operating signals representing a memory access sequence indicative of a read operation of memory element 29, control logic 120 monitors the voltage on high-side terminal 152 (or low-side terminal 154) of sense resistor 150 to determine whether the read operation is being performed in a forced current mode or a forced voltage mode. If a forced current mode is being employed, the voltage level on high-side terminal 152 will rise (e.g., a linear rise) for a time period following FIRE pad 46 being raised as sense line 52 charges. If a forced voltage mode is being employed, the voltage on high-side terminal 152 will remain relatively steady at the fixed voltage level of the input sense signal.

In one example, upon detecting a read operation, control logic 120 reads the memory value 36 corresponding to the memory element 29 identified as being accessed by the read operation. Based on the memory value 36, control logic 120 is able to determine an expected output response voltage level that should be present on SENSE pad 50 during a forced current mode read operation, and an expected output response current level that should be present on SENSE pad 50 during forced voltage mode read operation via a feedback loop formed with sense resistor 150.

Since memory circuit 30 is connected in parallel with fluidic ejection circuit 20 to sense line 52, during a read operation, in response to the analog sense signal being forced on sense line 52, an analog output response signal (e.g., a voltage or a current) from memory element 29 is present at second SENSE pad $50_1$. In one example, control logic 120 adjusts the voltage controlled current sources 122 and 124 to provide current to second SENSE pad $50_1$ or to draw current from second sense pad $50_1$ so that the combination of the output response from memory element 29 of fluidic ejection circuit 20 and the output response of control circuit 32 at second SENSE Pad 50 produces the expected analog output response level (voltage or current) at SENSE pad 50.

In one example, when in forced current mode, control logic 120 monitors the voltage at high-side terminal 152 of sense resistor 150 and adjusts voltage controlled current sources 122 and 124 to adjust an amount of current provided to second SENSE pad $50_1$ (either providing current to second SENSE pad $50_1$ or drawing current from second SENSE pad $50_1$) so that the combined response of memory circuit 30 and fluidic ejection circuit 20 provides the expected output response voltage level at SENSE pad 50.

Similarly, in one example, when in forced voltage mode, control logic monitors the voltage across sensor resistor 150 via high-side and low-side terminals 152 and 154 to determine the output response current level at SENSE pad 50. Control circuit 120 then adjusts voltage controlled current sources 122 and 124 to adjust the amount of current provided to second SENSE pad $50_1$ (either providing current to second SENSE pad $50_1$ or drawing current from second SENSE pad $50_1$) so that the combined response of memory circuit 30 and fluidic ejection circuit 20 provides the expected output response current level at SENSE pad 50.

By controlling voltage-controlled current sources 122 and 124 to provide an expected analog output response value at SENSE pad 50 based on the correct memory values for fluidic ejection circuit 20 as stored as memory values 36 by memory component 34, memory circuit 30 is able to replace a defective memory array 28 on fluidic ejection circuit 20 so that print component 10 is able to remain operational, thereby reducing the number of defective print components during manufacturing. Additionally, by connecting memory circuit 30 in parallel with fluidic ejection circuit to I/O pads 40, sensors 70 of fluidic ejection circuit 20 remain accessible at all times for monitoring via SENSE pad 50, such as by printer 60.

Figure 6A:
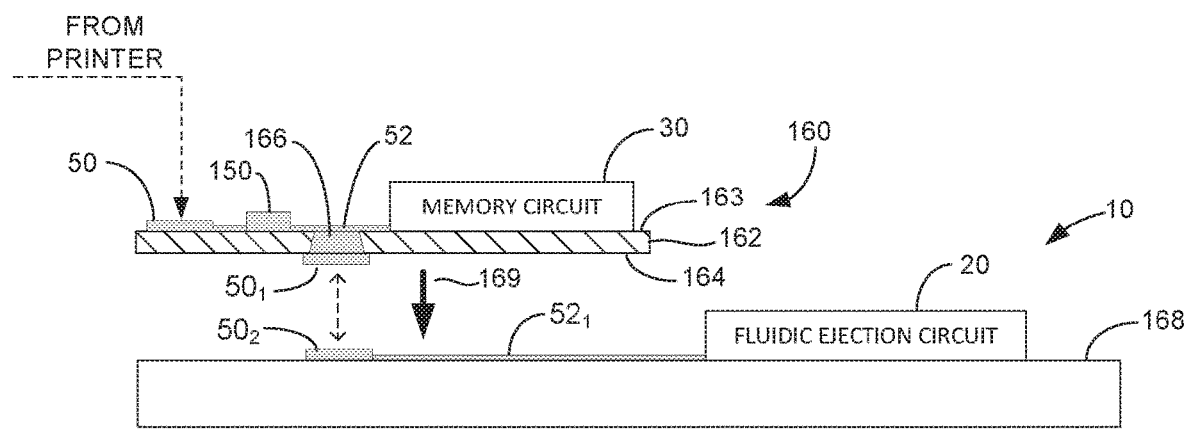
FIGS. 6A and 6B are block and schematic diagrams illustrating flexible wiring substrate for connecting a memory circuit to a print component, according to one examples.

FIG. 6A is a cross-sectional view illustrating portions of an overlay wiring substrate 160 for connecting memory circuit 20 to I/O terminals 40. In particular, FIG. 6A represents a cross-sectional view extending through SENSE pad 50 of FIG. 5, where memory circuit 30 is coupled in parallel with fluidic ejection circuit 20 to sense pad 50. In one example, overlay wiring substrate 160 includes a flexible substrate 162 having a first surface 163 and an opposing second surface 164. Memory circuit 30 and SENSE pad 50 are disposed on first surface 163, with a conductive trace representing sense line 52 connecting SENSE pad 50 to memory circuit 30. In one example, as illustrated, sense resistor 150 in disposed in series with sense line 52 between SENSE pad 50 and memory circuit 30. In one example, a conductive via 166 extends from sense line 52 at first surface 163 through flexible substrate 163 to second SENSE pad $50_1$ on second surface 164.

Print component 10 includes a substrate 168 on which fluidic ejection circuit 20 is mounted, and includes a SENSE pad $50_2$ coupled to fluidic ejection circuit 20 by a sense line $52_1$. When flexible wiring substrate 160 is coupled to print component 10, as indicated by the directional arrow 169, second SENSE pad $50_1$ aligns with SENSE pad $50_2$ to connect sense line 52 to SENSE pad $50_2$ between sense resistor 150 and memory circuit 30.

Figure 6B:
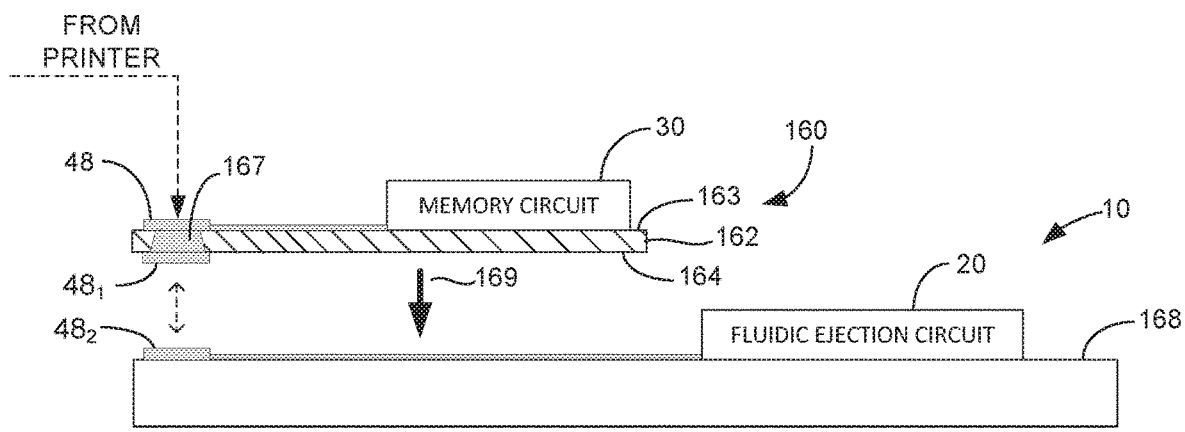

FIG. 6B is a block diagram generally illustrating a cross-sectional view of overlay wiring substrate 160 showing connections of I/O pads 40 other than SENSE pad 50, for example, such as MODE pad 48, for instance. As illustrated, MODE pad 48 is disposed on top surface 163 of substrate 162. A via 167 extends through substrate 162 to connect first MODE pad 48 to second MODE pad $48_1$ on second surface 164. When flexible wiring substrate 160 is coupled to print component 10, MODE pad $48_1$ aligns with MODE pad $48_2$ to connect MODE pad 48 to fluidic ejection circuit 20.

Figure 7:
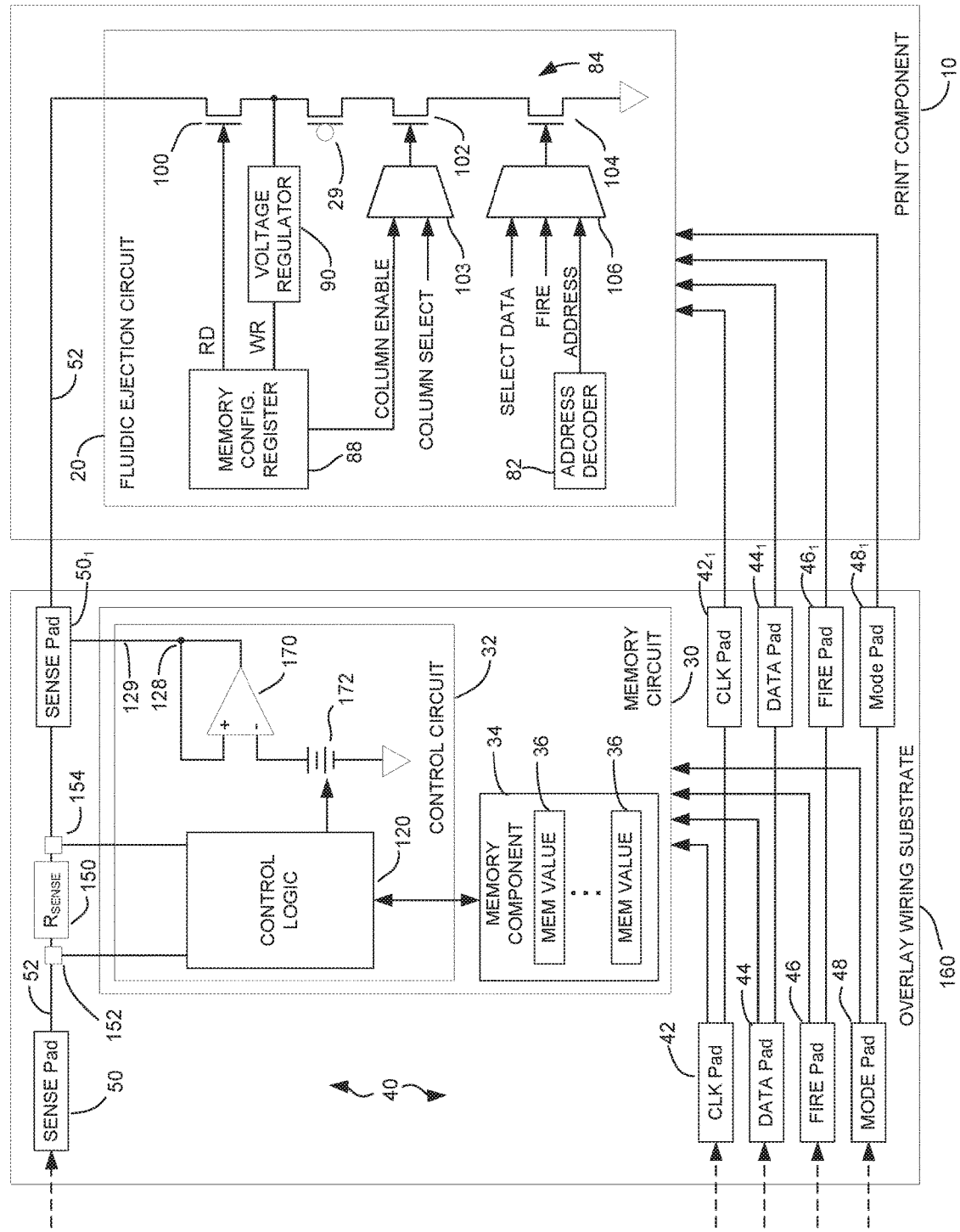
FIG. 7 is a block and schematic diagram illustrating a memory circuit for a print component, according to one example.

FIG. 7 is a block and schematic diagram generally illustrating memory circuit 10, according to one example. Portions of print component 10 are also generally illustrated. The example of FIG. 7 is similar to that of FIG. 5, where memory circuit 30 is connected in parallel with fluidic ejection device 20 to SENSE pad 50 during memory access operations. However, in the example of FIG. 7, control circuit 32 of memory circuit 30 includes an op-amp 170 and a controllable voltage source 172 in lieu of voltage-controlled current sources 122 and 124.

A first input of op-amp 170 is connected to a reference potential (e.g., ground) via controllable voltage source 172. A second input and an output of op-amp 170 are connected to node 128, with node 128 being connected to SENSE pad $50_1$ via line 129.

In one example, during a memory read operation, when in forced current mode, control logic 120 monitors the voltage at high-side terminal 152 of sense resistor 150 and adjusts the output voltage of op-amp 170 by adjusting the voltage level of controllable voltage source 172 (where the output voltage approximately follows that of controllable voltage source 172), so as to adjust an amount of current provided to second SENSE pad $50_1$ (either providing current to second SENSE pad $50_1$ or drawing current from second SENSE pad $50_1$) so that the combined response of memory circuit 30 and fluidic ejection circuit 20 provides the expected output response voltage level at SENSE pad 50.

Similarly, in one example, when in forced voltage mode, control logic monitors the voltage across sensor resistor 150 via high-side and low-side terminals 152 and 154 to determine the output response current level at SENSE pad 50. Control circuit 120 then adjusts the output voltage of op-amp 170 by adjusting the voltage level of controllable voltage source 172 (where the output voltage approximately follows that of controllable voltage source 172), so as to adjust the amount of current provided to second SENSE pad $50_1$ (either providing current to second SENSE pad $50_1$ or drawing current from second SENSE pad $50_1$) so that the combined response of memory circuit 30 and fluidic ejection circuit 20 provides the expected output response current level at SENSE pad 50.

Figure 8:
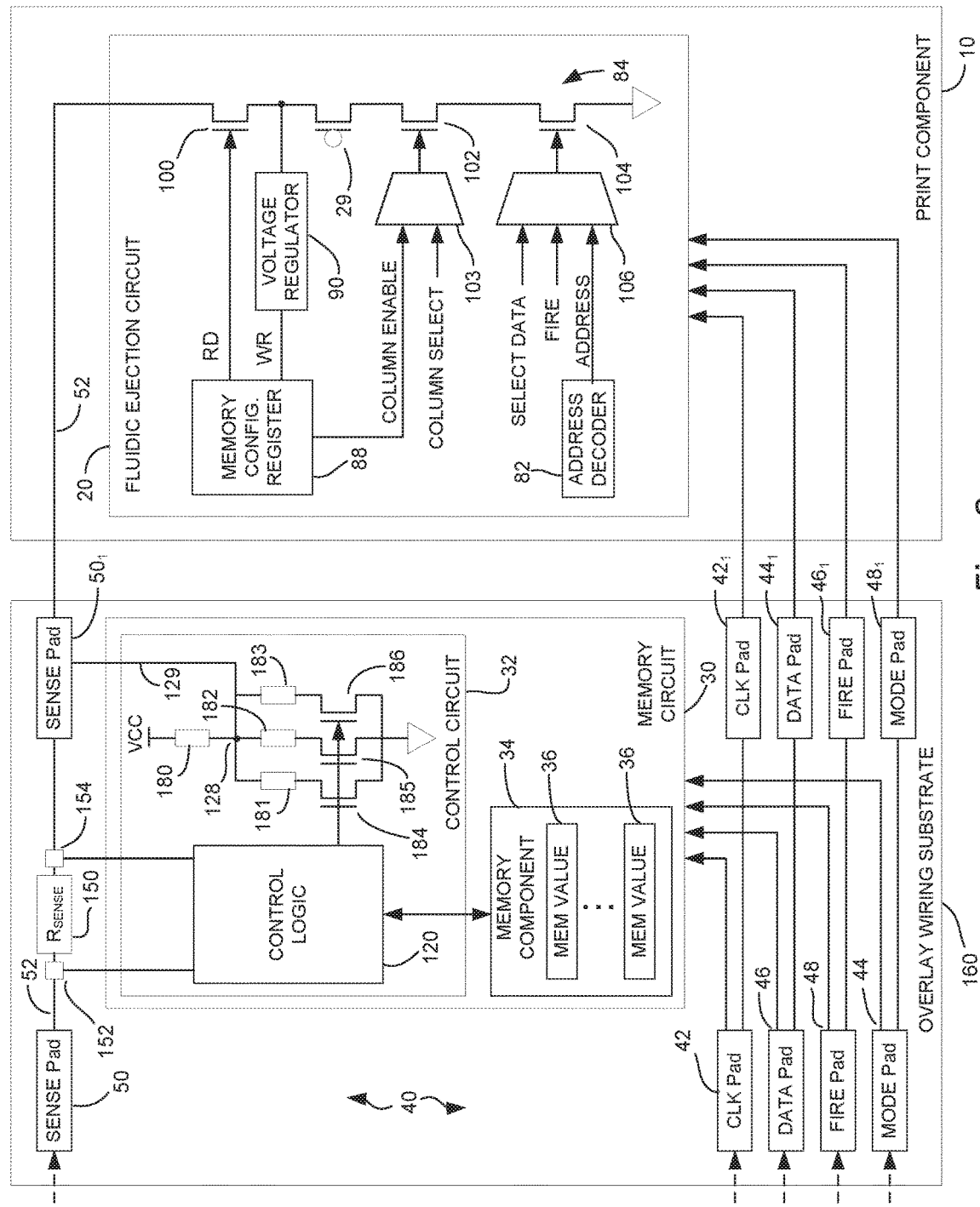
FIG. 8 is a block and schematic diagram illustrating a memory circuit for a print component, according to one example.

FIG. 8 is a block and schematic diagram of memory circuit 30 for print component 10, according to one example. The example of FIG. 8 is similar to that of FIG. 5, where memory circuit 30 is connected in parallel with fluidic ejection device 20 to SENSE pad 50 during memory access operations. However, in the example of FIG. 8, control circuit 32 of memory circuit 30 includes a number of resistors 180-183 which may be connected to form an adjustable voltage divider between voltage source VCC and a reference voltage (e.g., ground) in lieu of voltage-controlled current sources 122 and 124.

In example, a source resistor 180 is connected between voltage source VCC and node 128. Sink resistors 181-183 are connected in parallel with one another between node 128 and a reference voltage (e.g., ground) via respective switches 184-186. It is noted that a number of resistors different from that illustrated in FIG. 8 may be employed by control circuit 32.

In one example, during a memory read operation, when in forced current mode, control logic 120 monitors the voltage at high-side terminal 152 of sense resistor 150 and adjusts the number of sink resistors 181-183 which are connected between node 128 and ground via control of switches 184-186 to adjust an amount of current provided to second SENSE pad $50_1$ so that the combined response of memory circuit 30 and fluidic ejection circuit 20 provides the expected output response voltage level at SENSE pad 50.

Similarly, in one example, when in forced voltage mode, control logic monitors the voltage across sensor resistor 150 via high-side and low-side terminals 152 and 154 to determine the output response current level at SENSE pad 50. Control circuit 120 then adjusts the number of sink resistors 181-183 which are connected between node 128 and ground via control of switches 184-186 to adjust the amount of current provided to second SENSE pad $50_1$ (either providing current to second SENSE pad $50_1$ or drawing current from second SENSE pad $50_1$) so that the combined response of memory circuit 30 and fluidic ejection circuit 20 provides the expected output response current level at SENSE pad 50.

Figure 9:
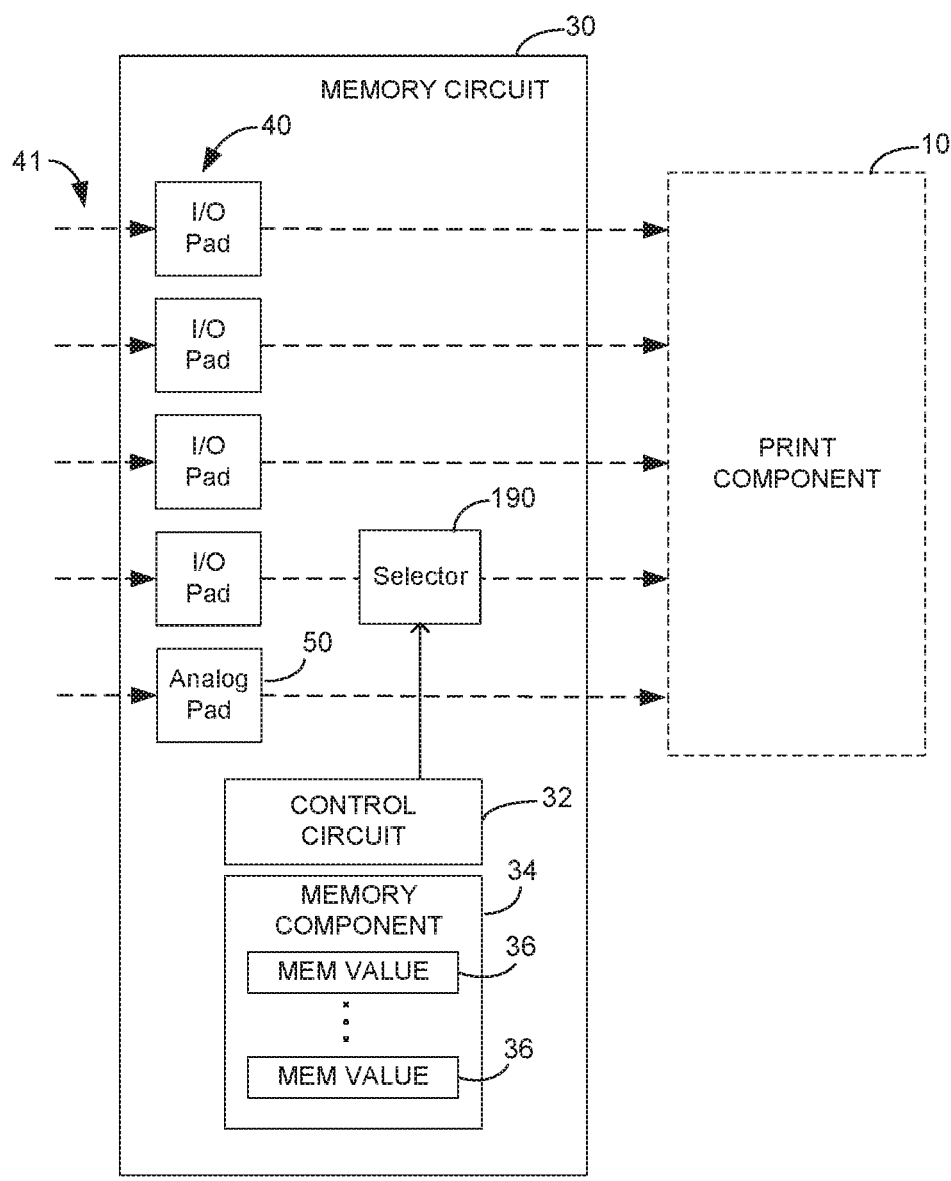
FIG. 9 is a block and schematic diagram illustrating a memory circuit for a print component, according to one example.

FIG. 9 is a block and schematic diagram generally illustrating memory circuit 30, according to one example. Memory circuit 30 includes a plurality of I/O pads 40, including an analog pad 50, to connect to a plurality of signal paths 41 communicating operating signals to print component 10. In one example, a controllable selector 190 is connected in-line with one of the signal paths 41 via the I/O pads 40, with the controllable selector 190 controllable to open the corresponding signal line to the print component 10 (to interrupt or break the connection to print component 10). In one example, in response to a sequence of operating signals received by I/O pads 40 representing a memory read, control circuit 32 opens controllable selector 190 to break the signal path to print component 10 to block a memory read of print component 10, and provides an analog signal to analog pad 50 to provide an analog electrical value at analog pad 50 representing stored memory values 36 selected by the memory read. By breaking the signal path during a memory read, print component 10 is unable to provide an analog signal to analog pad 50 during memory read operations. In examples, print component 10 is enabled to provide an analog signal pad 50 during non-memory read functions which access analog pad 50, such as a read of an analog component. In examples, such analog component may be a sense circuit (e.g., a thermal sensor).

Figure 10:
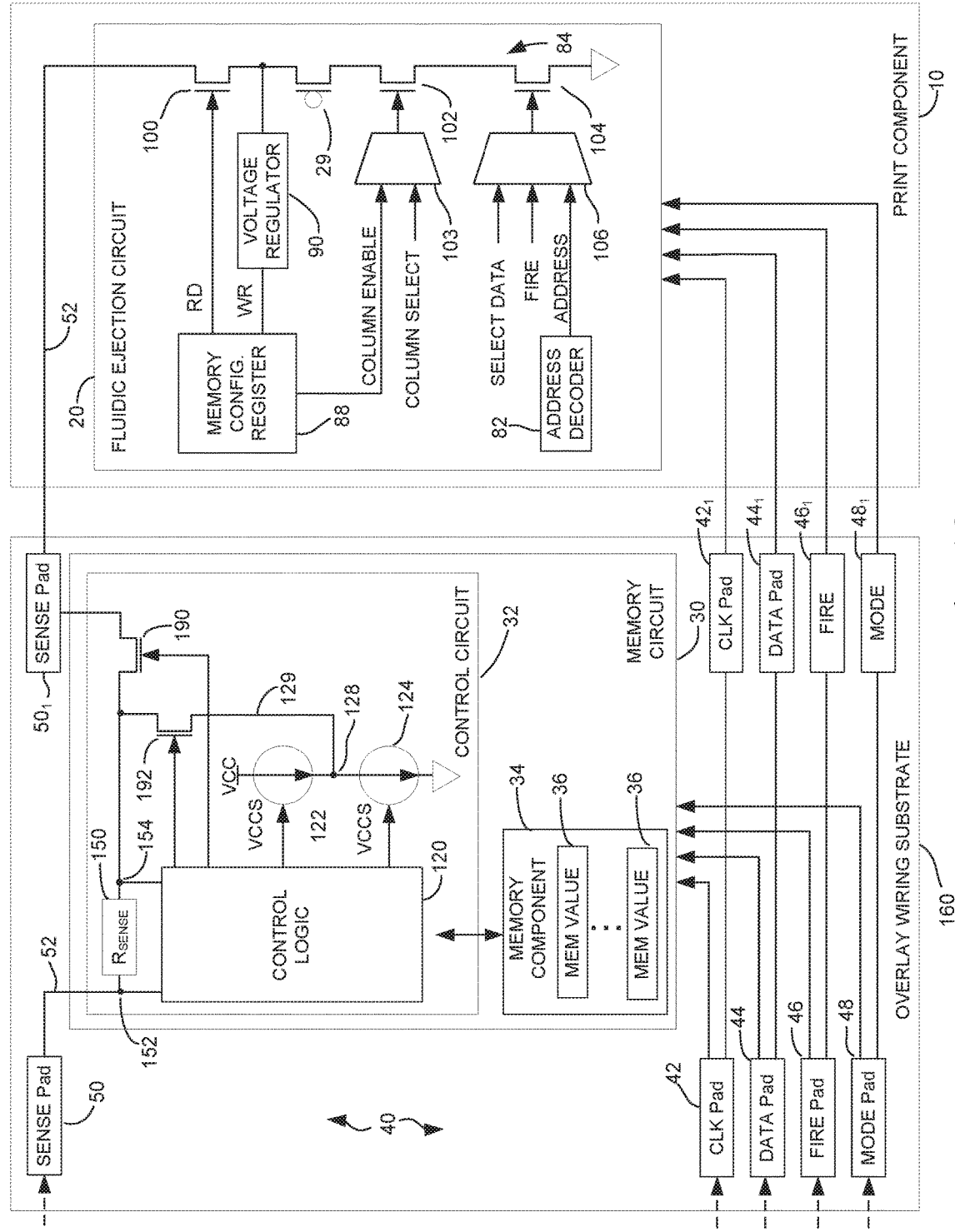
FIG. 10 is a block and schematic diagram illustrating a memory circuit for a print component, according to one example.

FIG. 10 is a block and schematic diagram illustrating memory circuit 30, according to one example of the present disclosure, where controllable selector 190 is a controllable switch 190. In the example of FIG. 10, I/O pads 40 include a first analog pad 50 and a second analog pad $50_1$ connected to an analog signal line 52, where controllable switch 90 is connect between analog pads 50 and $50_1$ so as to be connected in-line with analog signal line 52. In one example, as illustrated, control circuit 32 further includes a second controllable switch 192 connected to first analog pad 50. The example of FIG. 10 is similar to that of FIG. 5, except controllable selector switches 190 and 192 enable control circuit 32 to selectively couple and decouple memory circuit 30 and fluidic ejection circuit 20 from select line 52 such that, in one example, memory circuit 30 is not coupled in parallel with fluidic ejection circuit 20 during a memory access operation. Additionally, according to one example, sense resistor 150 along with high-side and low-side terminals 152 and 154 are disposed within memory circuit 32.

In one example, when control logic 120 identifies a non-memory access operation, control logic opens controllable selector switch 190 to disconnect voltage-controlled current sources 122 and 124 from sense line 52, and close selector switch 192 to connect fluid ejection circuit 20 to sense line 52, to enable monitoring of sensors 70 (see FIG. 3), such as by printer 60, without potential for interference in output signals of sensors 70 by control circuit 32.

In one example, when control logic 120 identifies a memory access operation, control logic may close selector switch 192 to connect node 128 and voltage-controlled current sources 122 and 124 to sense line 52, and open selector switch 190 to disconnect fluidic ejection circuit 20 from sense line 52, so that fluidic ejection circuit 20 is no longer connected in parallel with control circuit 32 to second SENSE pad $50_1$, so that fluidic ejection circuit 20 is blocked from responding to a memory read operation. Control circuit 32 can then adjust voltage controlled current sources 122 and 124 to provide the expected analog voltage response at SENSE pad 50, as described above with respect to FIG. 5, but without the contribution of an analog output response signal from fluidic ejection circuit 20. By disconnecting fluidic ejection circuit 20 from sense line 52 during memory access operations, potential contamination from defective memory elements 29 in the analog output response signal at SENSE pad 50 can be eliminated.

In other examples, controllable selector switch 190 may be connected in a similar fashion so as to be in-line with a fire signal path via FIRE pad, such that a fire signal is blocked from fluidic ejection circuit 20 during a memory read operation so that fluidic ejection circuit 20 is unable to respond to such memory read operation. In another example, controllable selector 190 may be a multiplexer coupled in-line with sense line 52 (or analog path 52), where the control circuit 32 operates the multiplexer operates to disconnect sense line 52 from fluidic ejection circuit 20 during a memory read, and otherwise operates to connect sense line 52 to fluid ejection circuit 20, such as during non-memory read operations which access analog sense pad 50 and sense line 52.

It is noted that the configurations of control circuit 32 described by FIGS. 6 and 7, and any number of other suitable control configurations, may be employed in the example print component 10 of FIG. 10.

Figure 11:
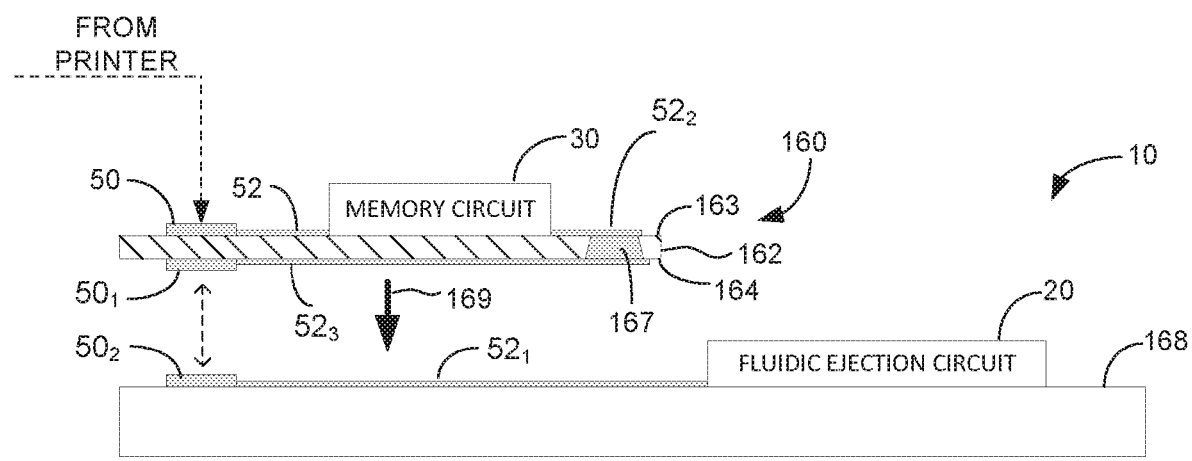
FIG. 11 is a block and schematic diagram illustrating flexible wiring substrate for connecting a memory circuit to a print component, according to one example.

FIG. 11 is a cross-sectional view illustrating portions of overlay wiring substrate 160 for connecting memory circuit 30 to I/O terminals 40 as illustrated by FIG. 10, according to one example. In particular, FIG. 11 represents a cross-sectional view extending through SENSE pad 50. In one example, memory circuit 30 and SENSE pad 50 are disposed on first surface 163 of flexible substrate 162, with a conductive trace representing sense line 52 connecting SENSE pad 50 to memory circuit 30. According to one example, sense resistor 150 and selector switches 190 and 192 are disposed internally to memory circuit 30. A conductive via 167 extends through flexible substrate 162, with memory circuit 30 being electrically connected to a SENSE pad 50$_2$ on second surface 164 of flexible substrate 162 with conductive traces 52$_2$ and 52$_3$ (representing portions of sense line 52) by way of via 167. When flexible wiring substrate 160 is coupled to print component 10, as indicated by arrow 169, sense pad 50$_2$ aligns with sense pad 50$_1$ such that SENSE pad 50 is coupled to fluidic ejection circuit 20 via selector switch 192 in memory circuit 30.

Figure 12:
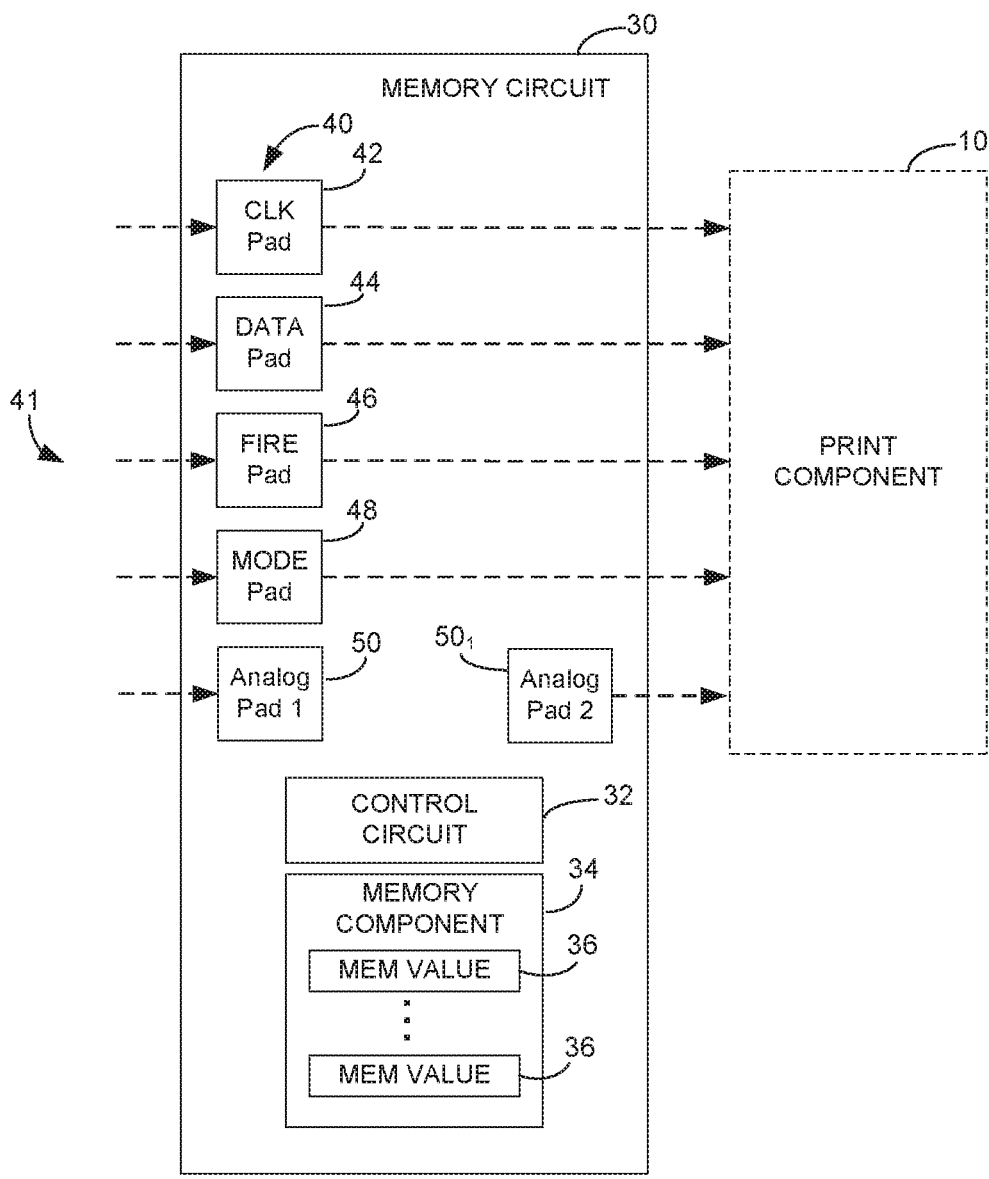
FIG. 12 is a block and schematic diagram illustrating a memory circuit for a print component, according to one example.

FIG. 12 is a block and schematic diagram generally illustrating memory circuit 30, according to one example. Memory circuit 30 includes a plurality of I/O pads 40, including first and second analog pads 1 and 2, indicated at 50 and 50$_1$, to connect a plurality of signal paths 41 to print component 10, including an analog signal path 52 connected to Analog Pads 50 and 50$_1$. In one example, the first analog pad 50 is electrically isolated from the second analog pad 50$_1$ to break the analog signal path to print component 10. In response to a sequence of operating signals on I/O pads 40 representing a memory read, control circuit 32 provides an analog signal to first analog pad 50 to provide an analog electrical value at first analog pad 50 representing stored memory values 36 selected by the memory read.

By breaking the analog signal path 52 during a memory read, print component 10 is disconnected from analog signal path 52 during memory read operations. As will be described in greater detail below, in addition to providing memory values 36 corresponding to memory elements of print component 10, memory values 36 may represent values for other functions that access print component 10 via analog signal path 52, such sensor read commands (e.g., to read thermal sensors).

Figure 13:
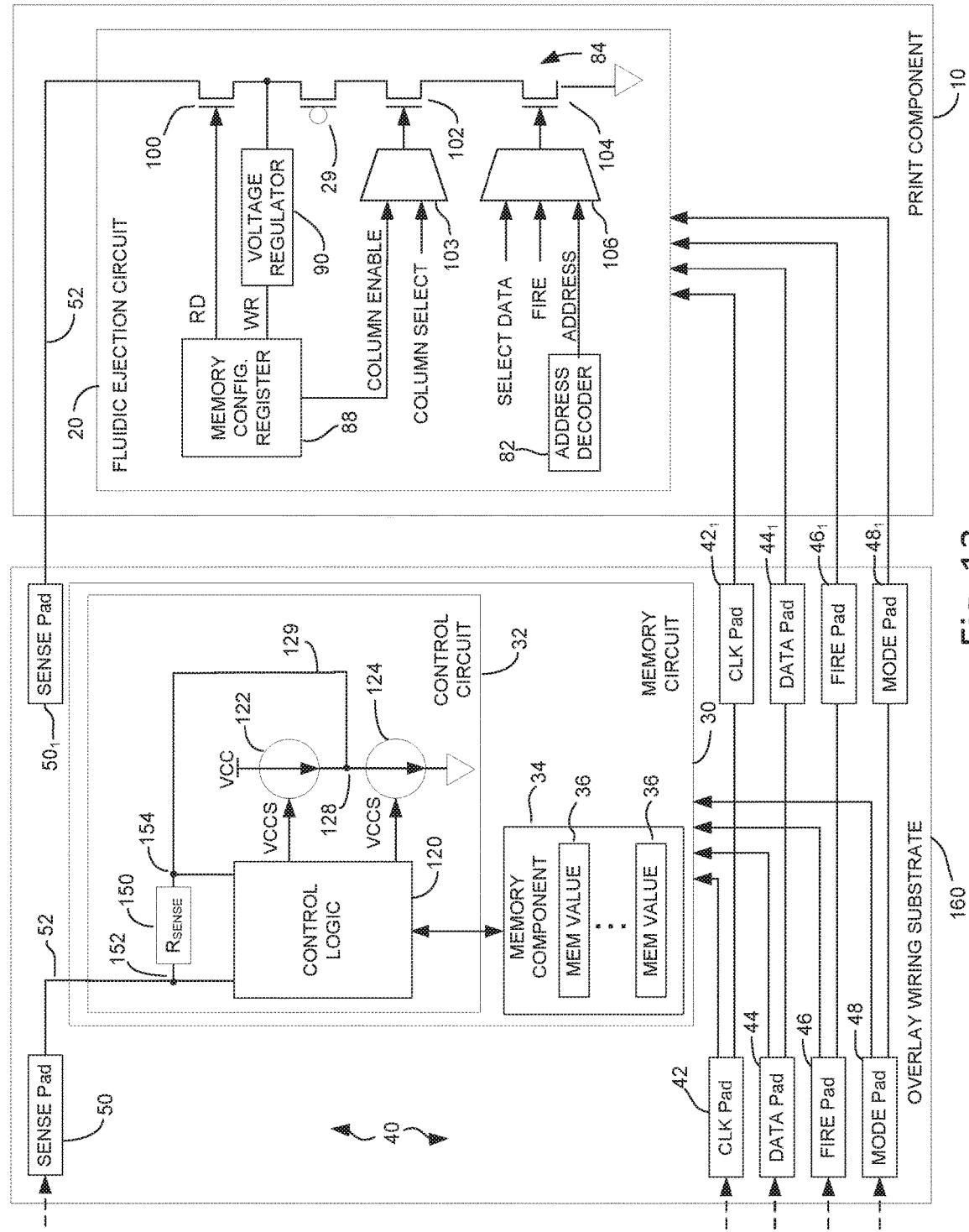
FIG. 13 is a block and schematic diagram illustrating a memory circuit for a print component, according to one example.

FIG. 13 is a block and schematic diagram of memory circuit 30, according to one example, and generally illustrating portions of print component 10. The example of FIG. 13 is similar to that of FIG. 10, but rather than including a selector switch (e.g., selector switch 192) to selectively control connection of fluidic ejection circuit 30 to sense line 52, fluidic ejection circuit 30 is physically decoupled from sense line 52. In one example, with reference to FIG. 14 below, overlay wiring substrate 160 is arranged to connect memory circuit 30 to select line 52 and to connect memory circuit 30 to I/O pads 42-48 in parallel with fluidic ejection circuit 20, while disconnecting fluidic ejection circuit 20 from SENSE pad 50.

In one example, upon identifying a memory access operation of fluidic ejection circuit 20 on I/O pads 40, control logic operates as described by FIGS. 4 and 8 above to update memory values 36 in view of write operations, and to provide expected analog output responses at SENSE pad 50 in view of read commands.

However, as described earlier, SENSE pad 50, via sense line 52, is also employed to read sensors 70 (see FIG. 3), such as thermal sensors and crack sensors, for example. Such sensors are read in a fashion similar to that of memory elements 29 of fluid ejection circuit 20, where an analog sense signal is applied to a sensor and an analog response signal is indicative of a sensed temperature in the case of a temperature sensor, and indicative of a presence or absence of a crack in the case of a crack sensor. In one example, in the case of a temperature sensor, an analog output signal representative of a sensed temperature within a designated operating temperature range is indicative of proper operation of fluidic ejection circuit 20, while a sensed temperature outside of the designated operating temperature range may indicate improper operation of fluidic ejection circuit 20 (e.g., overheating). Similarly, in the case of a crack sensor, an analog signal representative of sensed a resistance below a designated threshold value may indicate the absence of a crack in fluidic ejection circuit 20, while a sensed resistance above the designated threshold value may indicate the presence of a crack in fluidic ejection circuit 20.

In view of the above, in one example, in addition to memory component 34 including memory values 36 corresponding to memory elements 29 of fluidic ejection circuit 20, memory component 34 includes a memory value 36 corresponding to each of the sensors 70 of fluidic ejection circuit 20. In one example, the memory value 36 represents a value of an analog output signal to be provided by control circuit 32 at SENSE pad 50 in response to a read operation of the sensor 70 corresponding to the memory value 36 being recognized on I/O pads 40 by memory circuit 30. In one example, control logic 120 controls voltage controlled current sources 122 and 124 to provide an analog output signal at SENSE pad 50 as indicated by the corresponding memory value 36.

In view of the above, as described above, with SENSE pad 50 physically decoupled from fluidic ejection circuit 20, memory circuit 30 emulates analog output signal responses for memory elements 29 and sensors 70 of fluidic ejection circuit 20 based on memory values 36 stored by memory component 34. According to one example, memory circuit 30 of FIG. 13 may be mounted to print component 10 via flexible wiring substrate 160 to replace defective memory elements 26 and defective sensors 70 to maintain operation of print component 10.

In one example, memory circuit 30 of FIG. 13 may be temporarily mounted to print component 10 via flexible wiring substrate 160 and serve as a diagnostic circuit for testing a response to an external circuit, such as printer 60, to simulated conditions on fluidic ejection circuit 20. For example, memory values 36 corresponding to sensors 70 comprising temperature sensors may have values corresponding to temperature values outside of a desired operating temperature value range to test the response of printer 60 to such conditions. In other examples, memory values corresponding to sensors 70 comprising crack sensors may have values corresponding to a resistance value above a threshold value indicative of a presence of a crack to test the response of printer 60 to such conditions. Any number of other conditions may be simulated by memory circuit 30, thereby enabling a response of printer 60 to simulated operating conditions to be tested without access to fluidic ejection circuit 20 via sense line 52. In one example, after diagnostic has been completed, memory circuit 30 and flexible wiring circuit 160 may be removed from print component 10.

Figure 14:
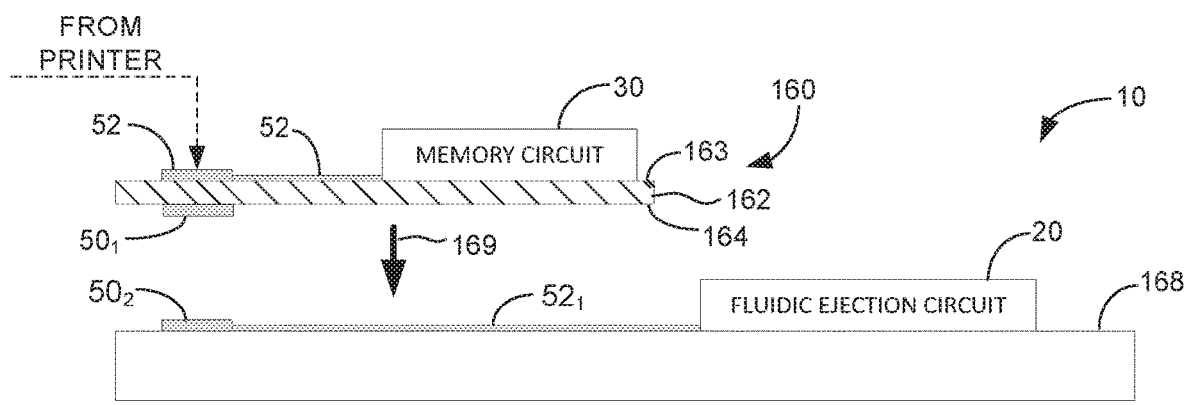
FIG. 14 is a block and schematic diagram illustrating flexible wiring substrate for connecting a memory circuit to a print component, according to one example.

FIG. 14 is a cross-sectional view illustrating portions of overlay wiring substrate 160 for connecting memory circuit 30 to I/O terminals 40 as illustrated by FIG. 13, according to one example. In particular, FIG. 14 represents a cross-sectional view extending through SENSE pad 50. In one example, memory circuit 30 and SENSE pad 50 are disposed on first surface 163 of flexible substrate 162, with a conductive trace representing sense line 52 connecting SENSE pad 50 to memory circuit 30. A second SENSE pad 50$_1$ is disposed on second surface 164 of substrate 162, and is electrically isolated from SENSE pad 50, sense line 52, and memory circuit 30. A SENSE pad $50_2$ is disposed on print component substrate 168 and is connected by conductive trace $52_1$ to fluidic ejection circuit 20. When flexible wiring substrate 160 is mounted to print component 10 (as indicated by direction arrow 169), SENSE pad $50_1$ aligns with and contacts SENSE pad $50_2$. Since SENSE pad $50_1$ is electrically isolated form SENSE pad 50, no electrical contact is made between SENSE pad 50 and underlying pad $50_1$, such that the connection between fluidic ejection circuit 20 and SENSE pad 50 is broken.

Figure 15:
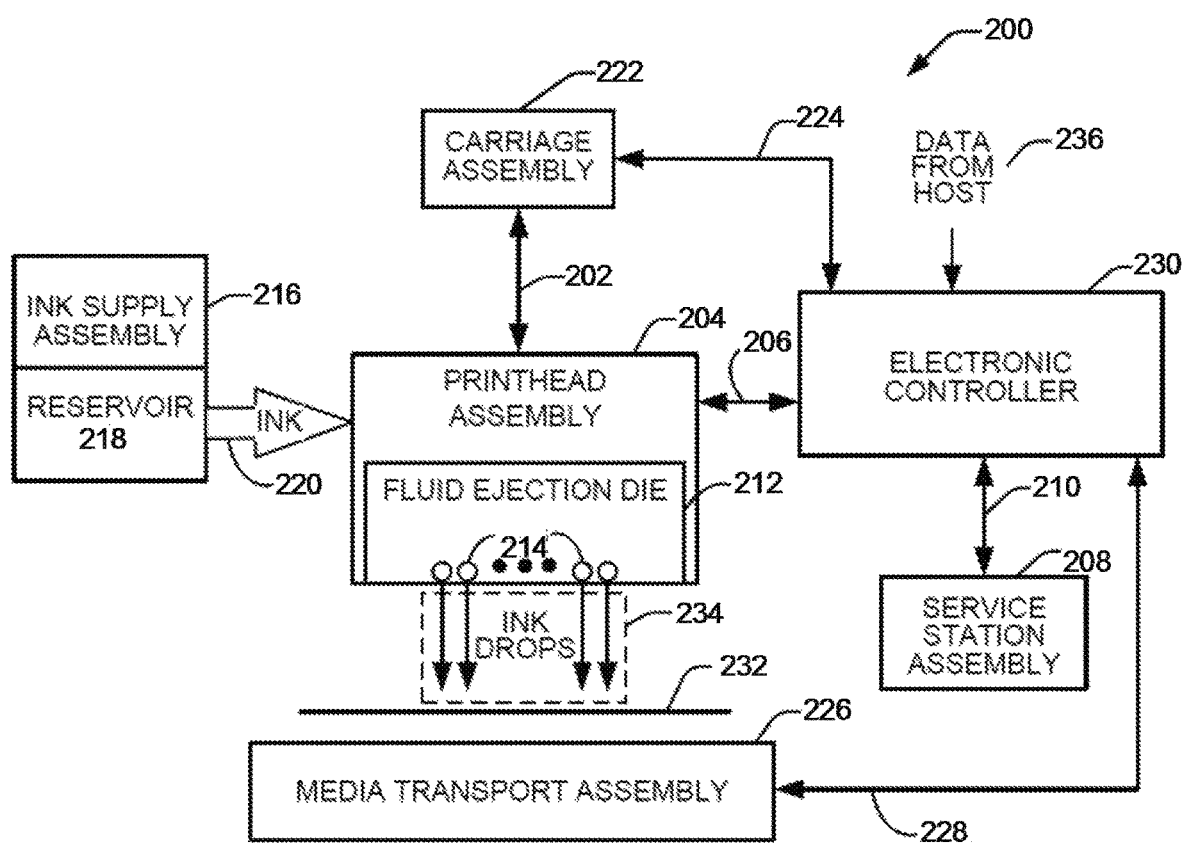
FIG. 15 is a block and schematic diagram illustrating a fluid ejection system, according to one example.

FIG. 15 is a block diagram illustrating one example of a fluid ejection system 200. Fluid ejection system 200 includes a fluid ejection assembly, such as printhead assembly 204, and a fluid supply assembly, such as ink supply assembly 216. In the illustrated example, fluid ejection system 200 also includes a service station assembly 208, a carriage assembly 222, a print media transport assembly 226, and an electronic controller 230. While the following description provides examples of systems and assemblies for fluid handling with regard to ink, the disclosed systems and assemblies are also applicable to the handling of fluids other than ink.

Printhead assembly 204 includes at least one printhead 212 which ejects drops of ink or fluid through a plurality of orifices or nozzles 214, where printhead 212 may be implemented, in one example, as fluidic ejection circuit 20, with fluid actuators (FAs) 26 implemented as nozzles 214, as previously described herein by FIG. 3, for instance. In one example, the drops are directed toward a medium, such as print media 232, so as to print onto print media 232. In one example, print media 232 includes any type of suitable sheet material, such as paper, card stock, transparencies, Mylar, fabric, and the like. In another example, print media 232 includes media for three-dimensional (3D) printing, such as a powder bed, or media for bioprinting and/or drug discovery testing, such as a reservoir or container. In one example, nozzles 214 are arranged in at least one column or array such that properly sequenced ejection of ink from nozzles 214 causes characters, symbols, and/or other graphics or images to be printed upon print media 232 as printhead assembly 204 and print media 232 are moved relative to each other.

Ink supply assembly 216 supplies ink to printhead assembly 204 and includes a reservoir 218 for storing ink. As such, in one example, ink flows from reservoir 218 to printhead assembly 204. In one example, printhead assembly 204 and ink supply assembly 216 are housed together in an inkjet or fluid-jet print cartridge or pen. In another example, ink supply assembly 216 is separate from printhead assembly 204 and supplies ink to printhead assembly 204 through an interface connection 220, such as a supply tube and/or valve.

Carriage assembly 222 positions printhead assembly 204 relative to print media transport assembly 226, and print media transport assembly 226 positions print media 232 relative to printhead assembly 204. Thus, a print zone 234 is defined adjacent to nozzles 214 in an area between printhead assembly 204 and print media 232. In one example, printhead assembly 204 is a scanning type printhead assembly such that carriage assembly 222 moves printhead assembly 204 relative to print media transport assembly 226. In another example, printhead assembly 204 is a non-scanning type printhead assembly such that carriage assembly 222 fixes printhead assembly 204 at a prescribed position relative to print media transport assembly 226.

Service station assembly 208 provides for spitting, wiping, capping, and/or priming of printhead assembly 204 to maintain the functionality of printhead assembly 204 and, more specifically, nozzles 214. For example, service station assembly 208 may include a rubber blade or wiper which is periodically passed over printhead assembly 204 to wipe and clean nozzles 214 of excess ink. In addition, service station assembly 208 may include a cap that covers printhead assembly 204 to protect nozzles 214 from drying out during periods of non-use. In addition, service station assembly 208 may include a spittoon into which printhead assembly 204 ejects ink during spits to ensure that reservoir 218 maintains an appropriate level of pressure and fluidity, and to ensure that nozzles 214 do not clog or weep. Functions of service station assembly 208 may include relative motion between service station assembly 208 and printhead assembly 204.

Electronic controller 230 communicates with printhead assembly 204 through a communication path 206, service station assembly 208 through a communication path 210, carriage assembly 222 through a communication path 224, and print media transport assembly 226 through a communication path 228. In one example, when printhead assembly 204 is mounted in carriage assembly 222, electronic controller 230 and printhead assembly 204 may communicate via carriage assembly 222 through a communication path $20_2$. Electronic controller 230 may also communicate with ink supply assembly 216 such that, in one implementation, a new (or used) ink supply may be detected.

Electronic controller 230 receives data 236 from a host system, such as a computer, and may include memory for temporarily storing data 236. Data 236 may be sent to fluid ejection system 200 along an electronic, infrared, optical or other information transfer path. Data 236 represent, for example, a document and/or file to be printed. As such, data 236 form a print job for fluid ejection system 200 and includes at least one print job command and/or command parameter.

In one example, electronic controller 230 provides control of printhead assembly 204 including timing control for ejection of ink drops from nozzles 214. As such, electronic controller 230 defines a pattern of ejected ink drops which form characters, symbols, and/or other graphics or images on print media 232. Timing control and, therefore, the pattern of ejected ink drops, is determined by the print job commands and/or command parameters. In one example, logic and drive circuitry forming a portion of electronic controller 230 is located on printhead assembly 204. In another example, logic and drive circuitry forming a portion of electronic controller 230 is located off printhead assembly 204. In another example, logic and drive circuitry forming a portion of electronic controller 230 is located off printhead assembly 204. In one example, electronic controller 230 may provide operating signals via I/O pads 40 to print component 10, such as illustrated by FIG. 1.

Although specific examples have been illustrated and described herein, a variety of alternate and/or equivalent implementations may be substituted for the specific examples shown and described without departing from the scope of the present disclosure. This application is intended to cover any adaptations or variations of the specific examples discussed herein. Therefore, it is intended that this disclosure be limited only by the claims and the equivalents thereof.

The invention claimed is:

1. A memory circuit separate from a fluid ejection die of a print component, the memory circuit comprising:
   a plurality of I/O pads to connect to a plurality of I/O signal paths which communicate operating signals between the print component and a printer, the plurality of I/O pads including an analog pad to receive and provide analog signals;

a memory component to store memory values associated with the print component; and a control circuit connected to the I/O pads, in response to detecting a sequence of operating signals on the I/O pads representing a memory read, to provide an analog signal to the analog pad to provide as output to the printer an analog electrical value at the analog pad representing stored memory values selected by the memory read.

2. The memory circuit of claim 1, in response to a sequence of operating signals on the I/O pads representing a memory write, the control circuit to update the stored memory elements identified by the memory write.

3. The memory circuit of claim 1, the analog pad being an analog sense pad.

4. The memory circuit of claim 1, the analog pad connected to an analog sense circuit.

5. The memory circuit of claim 1, the memory values of the memory circuit to supplement an array of memory elements of the print component.

6. The memory circuit of claim 1, the memory component and control circuit being on a same die.

7. The memory circuit of claim 1, the memory component comprising an array of memory cells storing the memory values.

8. The memory circuit of claim 1, the memory component comprising a look-up table of memory values.

9. The memory circuit of claim 1, the memory circuit to be coupled in parallel with the print component to the signal paths via the I/O pads.

10. A memory circuit for a print component comprising:

a plurality of I/O pads to connect to a plurality of I/O signal paths which communicate operating signals with the print component, the plurality of I/O pads including an analog pad to connect to, and to receive and provide analog signals on, a signal path which communicates analog operating signals of the print component;

a memory component to store memory values associated with the print component; and a control circuit, in response to a sequence of operating signals on the I/O pads representing a memory read, to provide an analog signal to the analog pad to provide an analog electrical value at the analog pad representing stored memory values selected by the memory read, and in response to a sequence of operating signals on the I/O pads representing non-memory read functions which access the analog pad, the control circuit to provide an analog signal to the analog pad to provide an analog electrical value at the analog pad representing stored memory values corresponding to the non-memory read functions.

11. The memory circuit of claim 10, the non-memory read function comprising a read of at least one analog component.

12. The memory circuit of claim 11, the at least one analog component comprising at least one sense circuit.

13. A print component comprising:

a number of I/O pads to communicate operating signals for controlling operation of the print component, the number of I/O pads including an analog pad to connect to and to receive and provide analog signals on a signal path which communicates analog operating signals of the print component, the I/O pads to connect to a fluid ejection die;

a memory circuit coupled to the I/O pads, the memory circuit including:

a memory component to store memory values associated with the print component; and a control circuit, in response to detecting a sequence of operating signals being communicated by the I/O pads representing a memory read of a memory of the fluid ejection die, to provide an analog signal on the analog pad representing the stored memory values corresponding to the memory read, such that the memory circuit is configured to at least partially replace or substitute a memory on the fluid ejection die.

14. The print component of claim 13, in response to a sequence of operating signals being communicated by the I/O pads representing a memory write, the control circuit to update the stored memory values identified by the memory write.

15. The print component of claim 13, the analog pad being an analog sense pad.

16. The print component of claim 13, the analog pad connected to an analog sense circuit.

17. The print component of claim 13, the fluidic ejection circuit including an array of memory elements, the memory values of the memory circuit to supplement the array of memory elements.

18. The print component of claim 13, the fluidic circuit and the memory circuit being separate dies.

19. The print component of claim 13, the memory component comprising an array of memory cells storing the memory values.

20. The print component of claim 13 the memory component comprising a lookup table of the memory values.

21. The print component of claim 13, the memory circuit coupled to the I/O pads in parallel with the fluidic ejection circuit.

22. A print component comprising:

a number of I/O pads to communicate operating signals for controlling operation of the print component, the number of I/O pads including an analog pad to connect to and to receive and provide analog signals on a signal path which communicates analog operating signals of the print component, the I/O pads to connect to a fluid ejection die; and a memory circuit coupled to the I/O pads, the memory circuit including:

a memory component to store memory values associated with the print component; and a control circuit to:

in response to a sequence of operating signals being communicated by the I/O pads representing a memory read, provide an analog signal on the analog pad representing the stored memory values corresponding to the memory read, and in response to a sequences of operating signals on the I/O pads representing non-memory read functions which access the analog pad, the control circuit to provide an analog signal to the analog pad to provide an analog electrical value at the analog pad representing stored memory values corresponding to the non-memory read functions so that the memory component is configured to at least partially replace and/or substitute a memory on the fluid ejection die.

23. A print component comprising:
a plurality of fluidic ejection dies, each die including:
an array of fluid actuators; and
an array of memory elements, each memory element to store a data bit representing data associated with the print component;
a number of I/O pads to communicate operating signals between the print component and a printer, the I/O pads connected to the fluidic ejection dies and including an analog sense pad connected in parallel with each of the fluidic ejection dies, the analog pad to receive and provide analog signals; and
a memory circuit coupled to the I/O pads, the memory circuit separate from the fluid ejection dies and including:
a memory component to store memory values associated with the print component; and
a control circuit, in response to detecting a sequence of operating signals being communicated by the I/O pads representing a memory read of memory elements of the fluidic ejection dies, to provide an analog signal at the analog sense pad representing stored memory values corresponding to memory elements identified by the memory read, such that the memory circuit at least partially replaces and/or substitutes the array of memory elements of at least one of the fluidic ejection dies.

24. The memory circuit of claim 1, wherein the memory circuit at least partially replaces or substitutes a memory of the fluid ejection die of the print component.

\* \* \* \* \*